(12) United States Patent
Pagaila

(10) Patent No.: US 9,418,962 B2
(45) Date of Patent: *Aug. 16, 2016

(54) SEMICONDUCTOR DEVICE AND METHOD OF FORMING WLP WITH SEMICONDUCTOR DIE EMBEDDED WITHIN PENETRABLE ENCAPSULANT BETWEEN TSV INTERPOSERS

(71) Applicant: STATS ChipPAC, Ltd., Singapore (SG)

(72) Inventor: Reza A. Pagaila, Tangerang (ID)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/710,393

(22) Filed: May 12, 2015

(65) Prior Publication Data

US 2015/0249065 A1 Sep. 3, 2015

Related U.S. Application Data

(63) Continuation of application No. 13/284,003, filed on Oct. 28, 2011, now Pat. No. 9,054,095, which is a continuation of application No. 12/876,425, filed on Sep. 7, 2010, now Pat. No. 8,080,445.

(51) Int. Cl.
*H01L 21/56* (2006.01)
*H01L 23/00* (2006.01)
(Continued)

(52) U.S. Cl.
CPC .............. *H01L 24/81* (2013.01); *H01L 21/56* (2013.01); *H01L 23/3157* (2013.01);
(Continued)

(58) Field of Classification Search
CPC .............. H01L 2924/181; H01L 2924/15311; H01L 2224/97; H01L 23/5389; H01L 2224/32145; H01L 23/49827; H01L 2924/14; H01L 2224/82; H01L 2224/94; H01L 21/56; H01L 21/304
See application file for complete search history.

(56) References Cited

U.S. PATENT DOCUMENTS 6,084,308 A * 7/2000 Kelkar .................. H01L 21/563
257/693
6,659,512 B1 * 12/2003 Harper ................ H01L 25/0657
257/777

(Continued)

OTHER PUBLICATIONS

Kripesh, V., "EMC-3d Seminar, Silicon Substrate Technology for SiP Modules", pp. 1-61, Institute of Microelectronics, Singapore, Jan. 23, 2007.

*Primary Examiner* — Mohsen Ahmadi
(74) *Attorney, Agent, or Firm* — Robert D. Atkins; Patent Law Group Atkins and Associates, P.C.

(57) ABSTRACT

A semiconductor device has a first substrate with a plurality of first conductive vias formed partially through the first substrate. A first semiconductor die is mounted over the first substrate and electrically connected to the first conductive vias. A plurality of bumps is formed over the first substrate. A second substrate has a plurality of second conductive vias formed partially through the second substrate. A penetrable encapsulant is deposited over the second substrate. The second substrate is mounted over the first substrate to embed the first semiconductor die and interconnect structure in the penetrable encapsulant. The encapsulant can be injected between the first and second substrates. A portion of the first substrate is removed to expose the first conductive vias. A portion of the second substrate is removed to expose the second conductive vias. A second semiconductor die is mounted over the second substrate.

15 Claims, 21 Drawing Sheets

(51) Int. Cl.
| | |
|---|---|
| *H01L 23/538* | (2006.01) |
| *H01L 25/03* | (2006.01) |
| *H01L 25/10* | (2006.01) |
| *H01L 25/00* | (2006.01) |
| *H01L 23/31* | (2006.01) |
| *H01L 23/498* | (2006.01) |
| *H01L 25/065* | (2006.01) |

(52) U.S. Cl.
CPC ..... *H01L 23/49827* (2013.01); *H01L 23/5389* (2013.01); *H01L 24/17* (2013.01); *H01L 25/03* (2013.01); *H01L 25/105* (2013.01); *H01L 25/50* (2013.01); *H01L 23/49816* (2013.01); *H01L 23/49833* (2013.01); *H01L 24/48* (2013.01); *H01L 24/73* (2013.01); *H01L 25/0657* (2013.01); *H01L 2224/0401* (2013.01); *H01L 2224/04026* (2013.01); *H01L 2224/1132* (2013.01); *H01L 2224/1145* (2013.01); *H01L 2224/11334* (2013.01); *H01L 2224/11462* (2013.01); *H01L 2224/11464* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/14181* (2013.01); *H01L 2224/16225* (2013.01); *H01L 2224/16227* (2013.01); *H01L 2224/32145* (2013.01); *H01L 2224/32225* (2013.01); *H01L 2224/48091* (2013.01); *H01L 2224/48227* (2013.01); *H01L 2224/48235* (2013.01); *H01L 2224/73204* (2013.01); *H01L 2224/73207* (2013.01); *H01L 2224/73253* (2013.01); *H01L 2224/73265* (2013.01); *H01L 2224/81024* (2013.01); *H01L 2224/81201* (2013.01); *H01L 2224/81805* (2013.01); *H01L 2224/81815* (2013.01); *H01L 2224/81986* (2013.01); *H01L 2225/06558* (2013.01); *H01L 2225/1023* (2013.01); *H01L 2225/1041* (2013.01); *H01L 2225/1058* (2013.01); *H01L 2924/01078* (2013.01); *H01L 2924/01079* (2013.01); *H01L 2924/01322* (2013.01); *H01L 2924/12041* (2013.01); *H01L 2924/12042* (2013.01); *H01L 2924/13091* (2013.01); *H01L 2924/157* (2013.01); *H01L 2924/1533* (2013.01); *H01L 2924/15311* (2013.01); *H01L 2924/15331* (2013.01); *H01L 2924/181* (2013.01); *H01L 2924/182* (2013.01)

(56) References Cited

U.S. PATENT DOCUMENTS

| | | | |
|---|---|---|---|
| 7,256,074 B2 * | 8/2007 | Voelz | H01L 21/56 257/E21.502 |
| 7,723,159 B2 | 5/2010 | Do et al. | |
| 7,776,655 B2 | 8/2010 | Do et al. | |
| 8,080,445 B1 | 12/2011 | Pagaila | |
| 8,106,499 B2 | 1/2012 | Camacho et al. | |
| 8,343,809 B2 * | 1/2013 | Lin | H01L 21/563 257/E21.502 |
| 2004/0113283 A1 * | 6/2004 | Farnworth | H01L 21/3043 257/782 |
| 2005/0067714 A1 | 3/2005 | Rumer et al. | |
| 2006/0220256 A1 * | 10/2006 | Shim | H01L 23/3135 257/777 |
| 2006/0275952 A1 | 12/2006 | Gowda et al. | |
| 2006/0289984 A1 | 12/2006 | Fontana, Jr. et al. | |
| 2007/0205495 A1 | 9/2007 | Fernandez et al. | |
| 2008/0237310 A1 * | 10/2008 | Periaman | H01L 24/73 228/180.5 |
| 2008/0272477 A1 | 11/2008 | Do et al. | |
| 2008/0284066 A1 | 11/2008 | Kuan et al. | |
| 2009/0051024 A1 | 2/2009 | Chia | |
| 2009/0134515 A1 | 5/2009 | Hu | |
| 2009/0152740 A1 * | 6/2009 | Park | H01L 23/552 257/778 |
| 2009/0155961 A1 | 6/2009 | Ko et al. | |
| 2009/0160071 A1 * | 6/2009 | Shen | H01L 21/568 257/786 |
| 2009/0166825 A1 | 7/2009 | Camacho et al. | |
| 2009/0184784 A1 | 7/2009 | Chun et al. | |
| 2009/0206455 A1 * | 8/2009 | Harper | H01L 23/3128 257/659 |
| 2009/0230531 A1 * | 9/2009 | Do | H01L 21/56 257/685 |
| 2009/0236718 A1 | 9/2009 | Yang et al. | |
| 2009/0236752 A1 | 9/2009 | Lee et al. | |
| 2009/0283870 A1 * | 11/2009 | Pagaila | H01L 21/56 257/620 |
| 2009/0294899 A1 | 12/2009 | Pagaila et al. | |
| 2010/0032821 A1 | 2/2010 | Pagaila et al. | |
| 2010/0065948 A1 | 3/2010 | Bae et al. | |
| 2010/0072618 A1 | 3/2010 | Camacho et al. | |
| 2010/0078789 A1 | 4/2010 | Choi et al. | |
| 2010/0193931 A1 | 8/2010 | Do et al. | |
| 2010/0244212 A1 | 9/2010 | Ha et al. | |
| 2010/0244232 A1 | 9/2010 | Pagaila et al. | |
| 2011/0215458 A1 | 9/2011 | Camacho et al. | |
| 2011/0233748 A1 | 9/2011 | Joshi | |
| 2011/0312133 A1 | 12/2011 | Park et al. | |
| 2012/0199963 A9 | 8/2012 | Do et al. | |

* cited by examiner

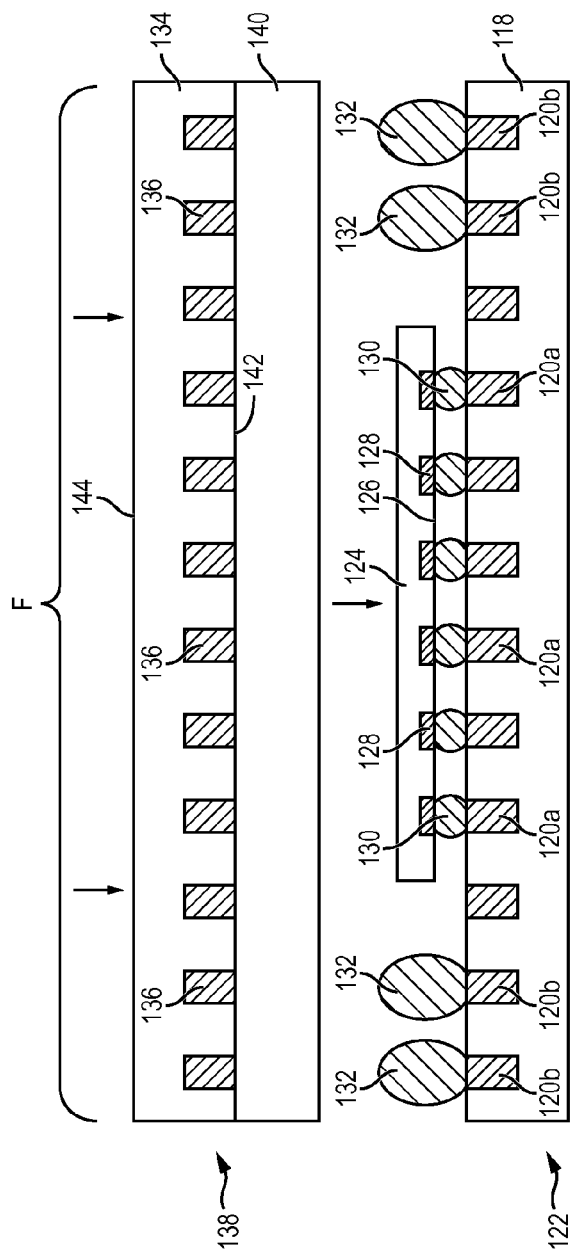
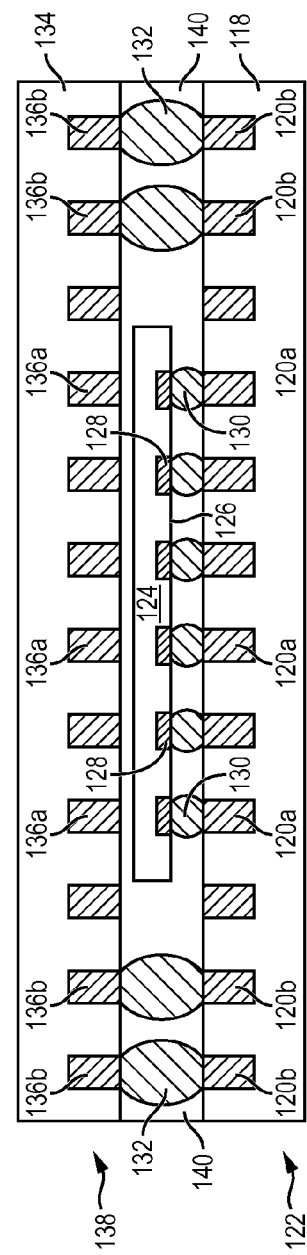
FIG. 3d
FIG. 3e

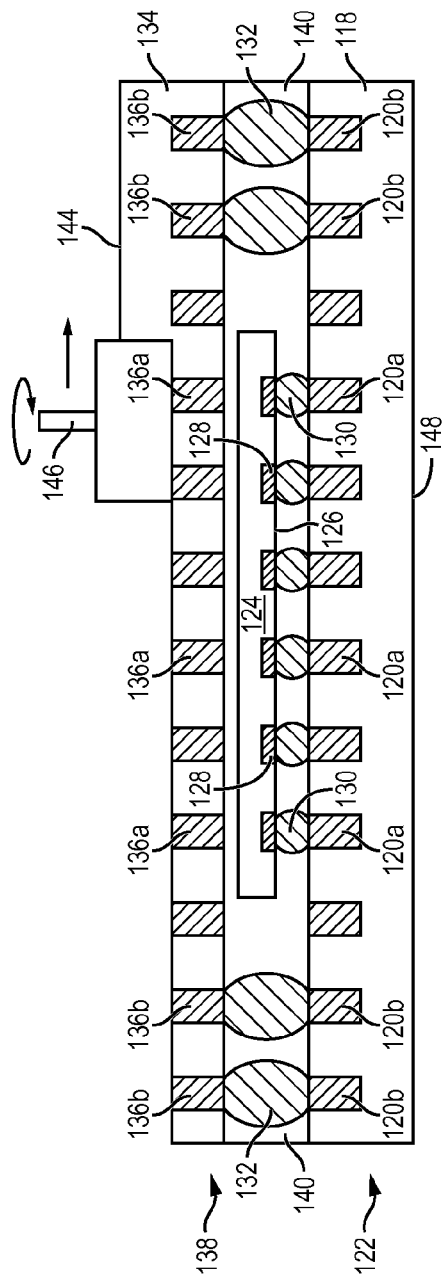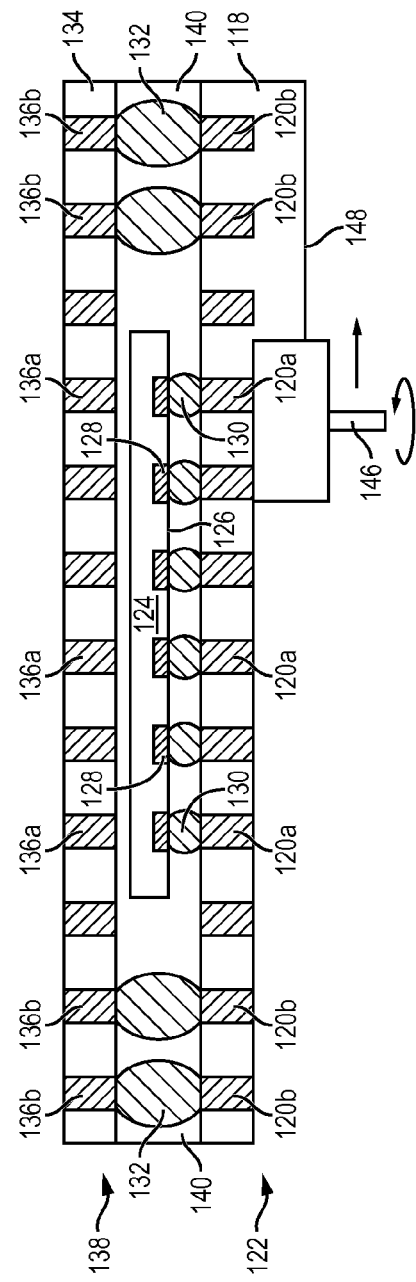

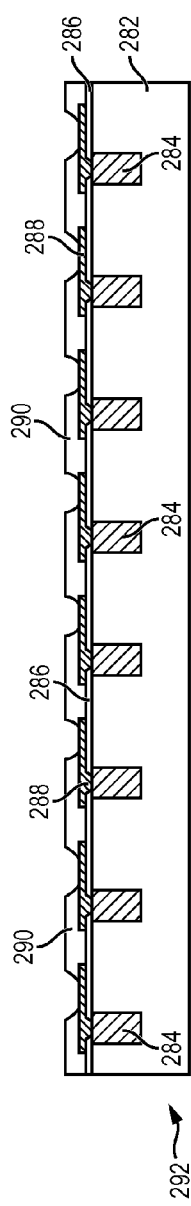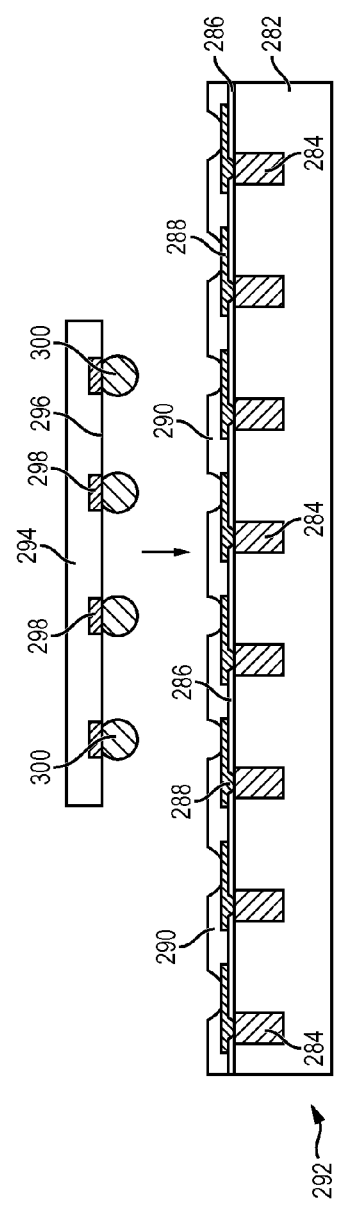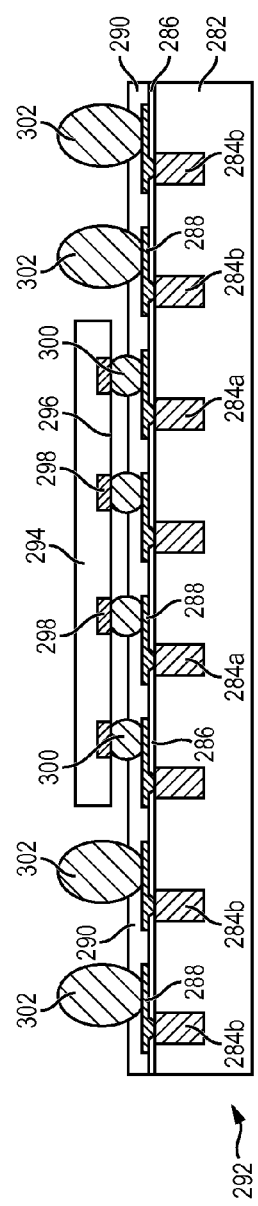

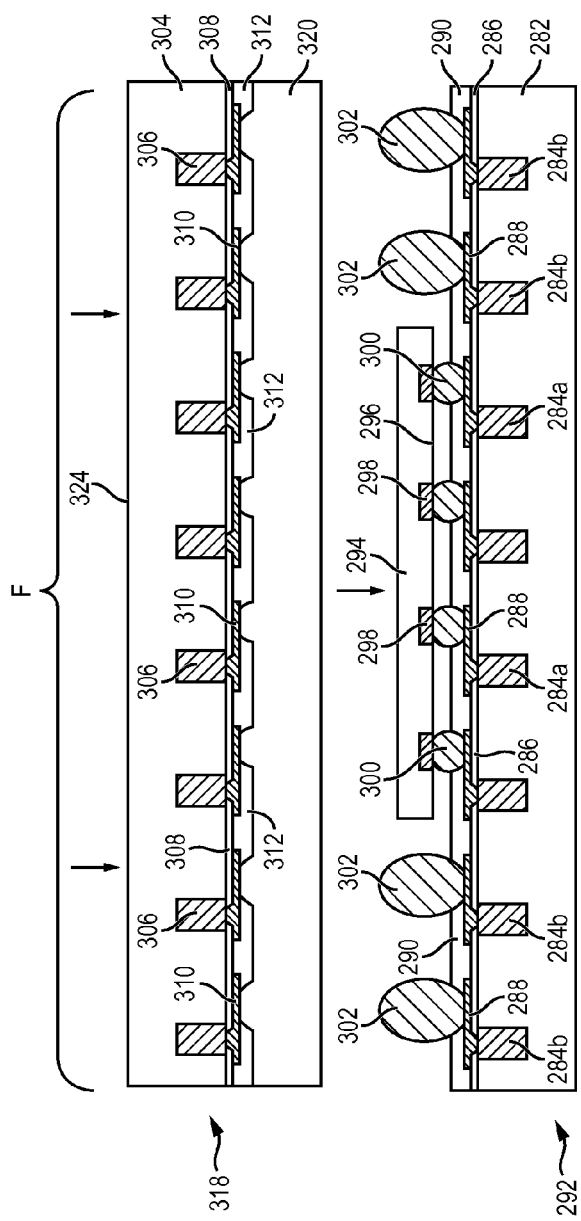
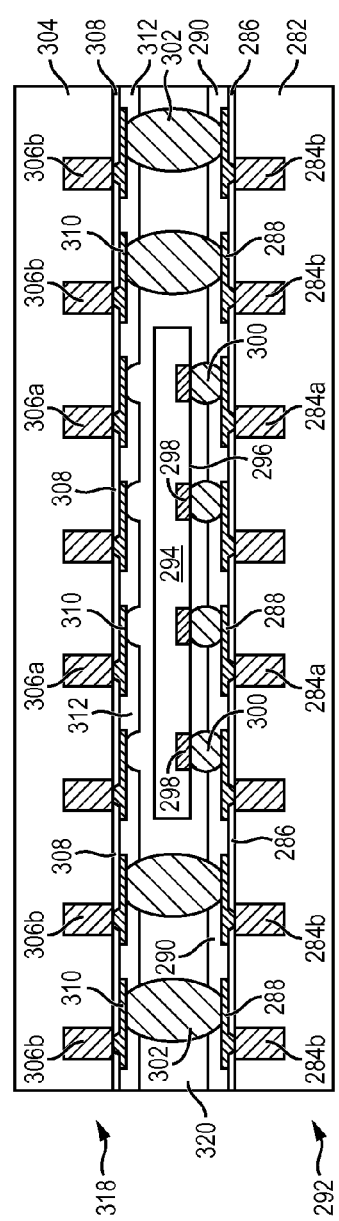
FIG. 11d
FIG. 11e

SEMICONDUCTOR DEVICE AND METHOD OF FORMING WLP WITH SEMICONDUCTOR DIE EMBEDDED WITHIN PENETRABLE ENCAPSULANT BETWEEN TSV INTERPOSERS

CLAIM TO DOMESTIC PRIORITY

The present application is a continuation of U.S. patent application Ser. No. 13/284,003, filed Oct. 28, 2011, which is a continuation of U.S. patent application Ser. No. 12/876,425, filed Sep. 7, 2010, now U.S. Pat. No. 8,080,445, which applications are incorporated herein by reference.

FIELD OF THE INVENTION

The present invention relates in general to semiconductor devices and, more particularly, to a semiconductor device and method of forming a WLP with a semiconductor die embedded within a penetrable encapsulant between TSV interposers.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In a wafer level package (WLP), a semiconductor die is commonly mounted over a temporary support carrier with an adhesive layer. An encapsulant or molding compound is deposited over the semiconductor die for environmental protection from external elements and contaminants. Following encapsulation, the temporary carrier and adhesive layer are removed and a build-up interconnect structure is formed over the semiconductor die and encapsulant. A variety of semiconductor die or packages can be stacked over the WLP and electrically connected through vertical interconnect structures. With increasing signal processing requirements, there are ongoing needs to decrease the interconnect pitch and increase input/output (I/O) count.

SUMMARY OF THE INVENTION

A need exists for an efficient die stacking structure with a fine pitch vertical interconnect. Accordingly, in one embodiment, the present invention is a method of making a semiconductor device comprising the steps of providing a first substrate including a first conductive via extending into the first substrate, disposing a first semiconductor die over the first substrate, providing a second substrate including a second conductive via extending into the second substrate, disposed the second substrate over the first substrate and first semiconductor die, forming an interconnect structure between the first substrate and second substrate, and disposing an encapsulant between the first substrate and second substrate.

In another embodiment, the present invention is a method of making a semiconductor device comprising the steps of providing a first substrate including a first conductive via extending partially into the first substrate, providing a second substrate including a second conductive via extending partially into the second substrate, disposing a first semiconductor die between the first substrate and second substrate, and disposing an encapsulant between the first substrate and second substrate.

In another embodiment, the present invention is a method of making a semiconductor device comprising the steps of providing a first substrate including a first conductive via extending into the first substrate, providing a second substrate including a second conductive via extending into the second substrate, disposing a first semiconductor die between the first substrate and second substrate, and forming an interconnect structure between the first substrate and second substrate.

In another embodiment, the present invention is a semiconductor device comprising a first substrate including a first conductive via extending into the first substrate. A second substrate includes a second conductive via extending into the second substrate. A first semiconductor die is disposed between the first substrate and second substrate. An interconnect structure is formed between the first substrate and second substrate.

BRIEF DESCRIPTION OF THE DRAWINGS

FIGS. 3a-3i illustrate a process of forming a semiconductor die embedded within a penetrable encapsulant between TSV interposers;

FIGS. 11a-11i illustrate a process of forming a semiconductor die embedded within a penetrable encapsulant between TSV interposers with a first RDL structure;

DETAILED DESCRIPTION OF THE DRAWINGS

Figure 1:
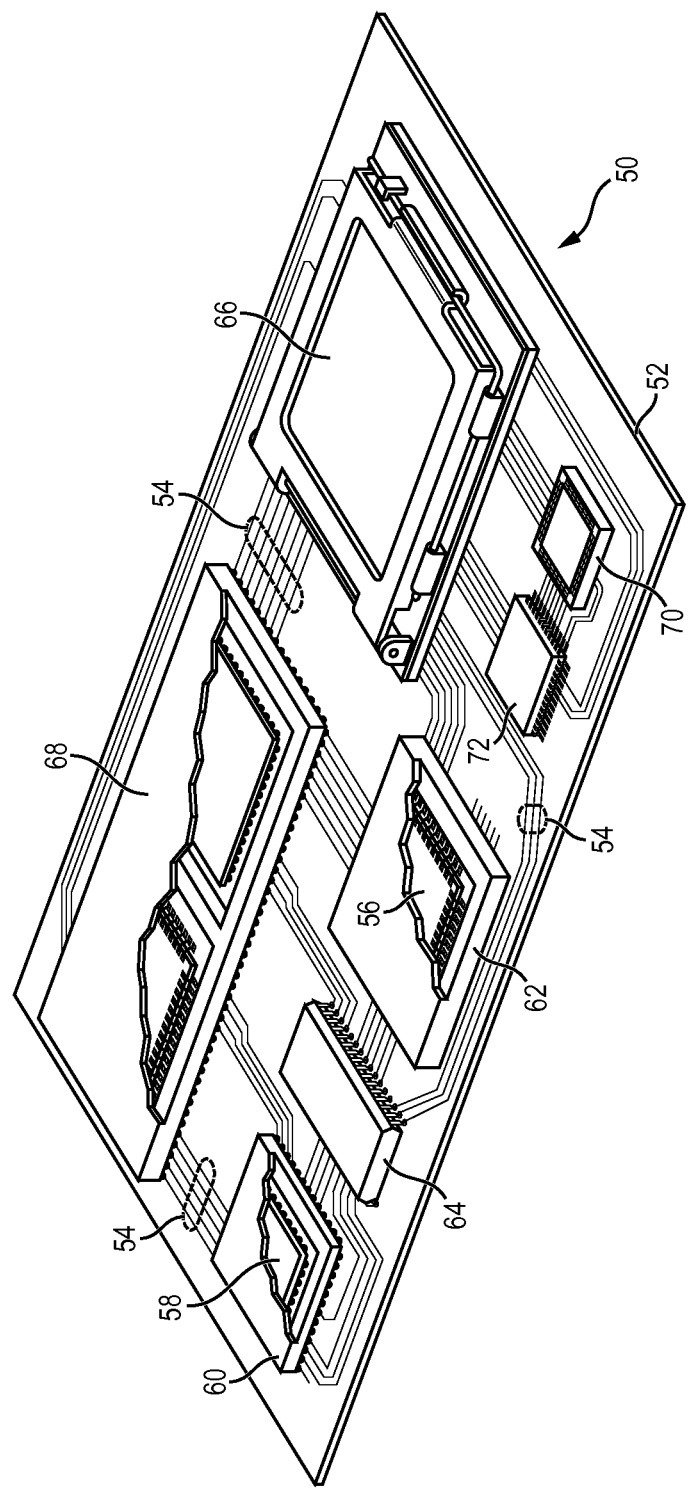
FIG. 1 illustrates a PCB with different types of packages mounted over its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted over a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
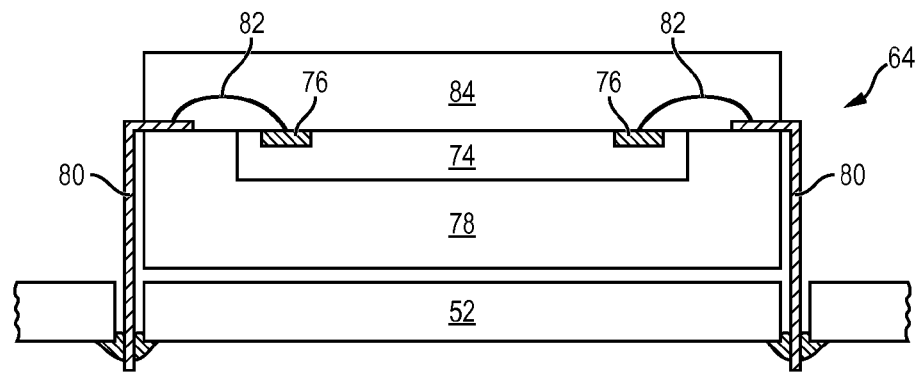
FIGS. 2a-2c illustrate further detail of the representative semiconductor packages mounted over the PCB.
Figure 2B:
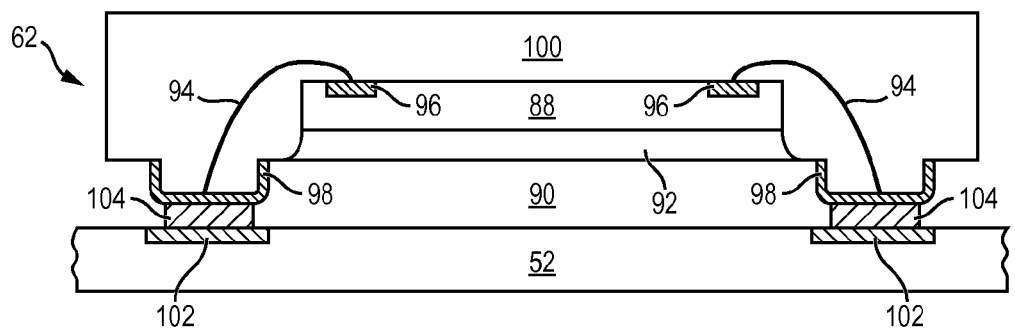
Figure 2C:
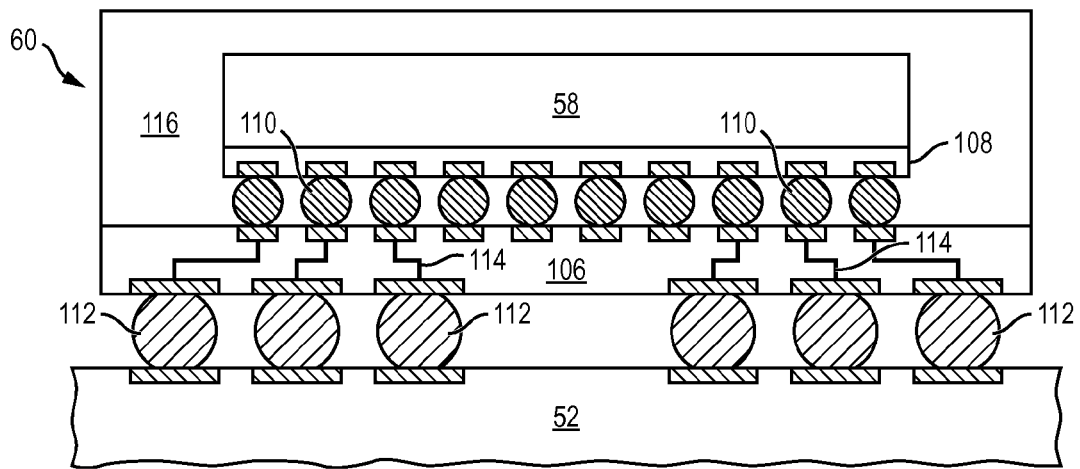

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted over an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
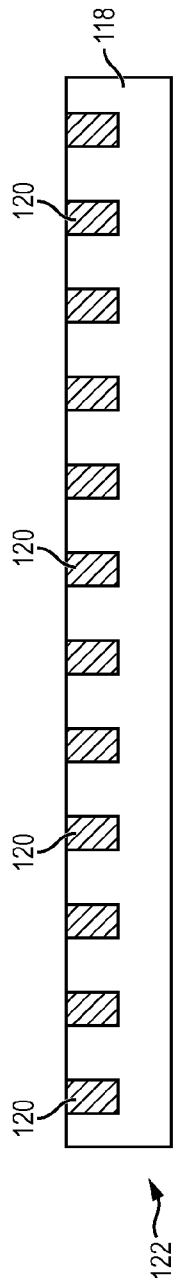

FIGS. 3a-3i illustrate, in relation to FIGS. 1 and 2a-2c, a process of forming a WLP with a semiconductor die embedded within a penetrable encapsulant between TSV interposers. FIG. 3a shows a semiconductor wafer or substrate 118 containing a base material, such as silicon, germanium, gallium arsenide, indium phosphide, or silicon carbide, for structural support. A plurality of vias is formed partially through substrate 118 using laser drilling, mechanical drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction vertical interconnect blind conductive vias 120. In another embodiment, conductive vias are formed completely through substrate 118. Substrate 118 with conductive vias 120 constitute a through silicon via (TSV) interposer 122.

Figure 3B:
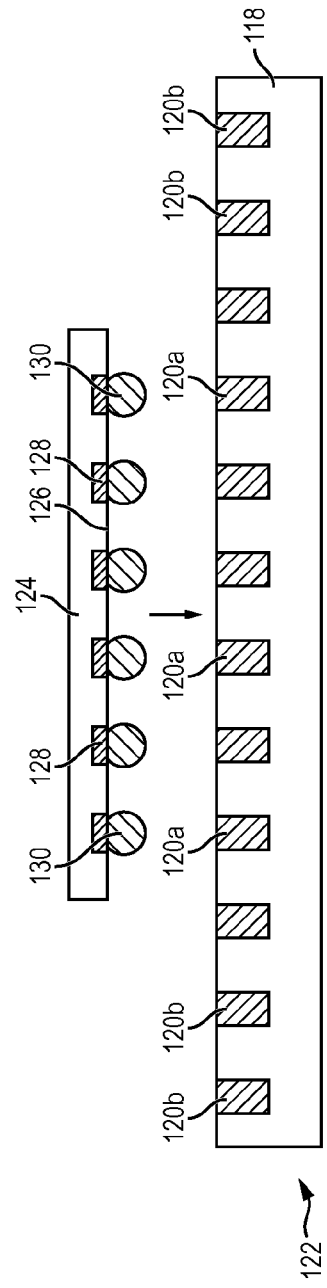

In FIG. 3b, semiconductor die 124 has an active surface 126 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 126 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. Contact pads 128 are formed in active surface 126 and electrically connected to the circuits on the active surface. Bumps 130 are formed over contact pads 128. In one embodiment, semiconductor die 124 is a flipchip type semiconductor die. Alternatively, semiconductor die 124 can be a wire-bond die. FIG. 3b shows a portion of TSV interposer 122 associated with one semiconductor die. TSV interposer 122 extends beyond the dimensions shown in FIG. 3b for a wafer level multi-die attachment.

Figure 3C:
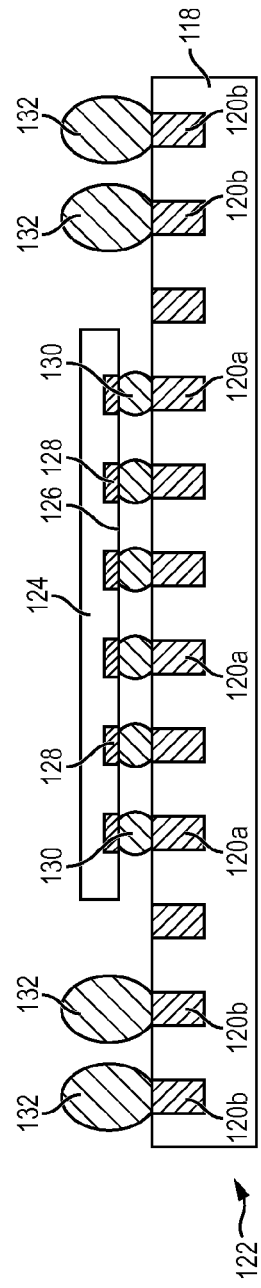

In FIG. 3c, semiconductor die 124 is mounted over TSV interposer 122 with bumps 130 contacting conductive vias 120a. An electrically conductive bump material is deposited over conductive vias 120b using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive vias 120b using a suitable attachment or bonding process. In one embodiment, the bump material is reflowed by heating the material above its melting point to form spherical balls or bumps 132. In some applications, bumps 132 are reflowed a second time to improve electrical contact to conductive vias 120b. The bumps can also be compression bonded to conductive vias 120b. Bumps 132 represent one type of interconnect structure that can be formed over conductive vias 120b. The interconnect structure can also use conductive pillars, stacked bumps, or other electrical interconnect.

FIG. 3d shows a semiconductor wafer or substrate 134 containing a base material, such as silicon, germanium, gallium arsenide, indium phosphide, or silicon carbide, for structural support. A plurality of vias is formed partially through substrate 134 using laser drilling, mechanical drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect blind conductive vias 136. In another embodiment, conductive vias are formed completely through substrate 134. Substrate 134 with conductive vias 136 constitutes a TSV interposer 138.

A penetrable encapsulant or adhesive layer 140 is deposited or otherwise applied over surface 142 of TSV interposer 138. In one embodiment, a B-stage curable encapsulant is deposited over surface 142 using spin coating or screen printing with a thickness greater than a height of semiconductor die 124 or bumps 132. Penetrable encapsulant 140 can also be a polymer material, such as an epoxy resin. Penetrable encapsulant 140 may contain a particulate filler to exhibit thermally conductive properties for heat dissipation from semiconductor die 124. The particulate filler includes materials such as silica, aluminum nitride, carbon black, alumina, aluminum, or other similar metals.

Leading with penetrable encapsulant 140, TSV interposer 138 is placed over and mounted to TSV interposer 122, semiconductor die 124, and bumps 132. A force F is applied to surface 144 of TSV interposer 138, opposite surface 142, to envelop semiconductor die 124 and bumps 132 with penetrable encapsulant 140. The requisite force F is about 1 MPa. The force F is removed after penetrable encapsulant 140 comes into close proximity or touches TSV interposer 122 and bumps 132 come into close proximity or touch conductive vias 136b. The requisite force to envelop semiconductor die 124 and bumps 132 with penetrable encapsulant 140 can be achieved in a vacuum.

FIG. 3e shows semiconductor die 124 and bumps 132 embedded within penetrable encapsulant 140. The penetrable encapsulant 140 is cured at 75° C. for a duration of 10-30 seconds, and remains at 175° C. after cure for 60 minutes, to harden the material and securely hold semiconductor die 124 and bumps 132. The elevated temperature also serves to metallurgically and electrically connect bumps 130 to conductive vias 120a and bumps 132 to conductive vias 120b and 136b.

In the case of blind conductive vias 136, a portion of surface 144 of TSV interposer 138 is removed by grinder 146 to expose conductive vias 136, as shown in FIG. 3f. Likewise, in the case of blind conductive vias 120, a portion of surface 148 of TSV interposer 122 is removed by grinder 146 to expose conductive vias 120, as shown in FIG. 3g. Following the grinding operations, conductive vias 120 are electrically isolated from each other and conductive vias 136 are electrically isolated from each other. The grinding operations also reduce the thickness of TSV interposers 122 and 138.

Figure 3H:
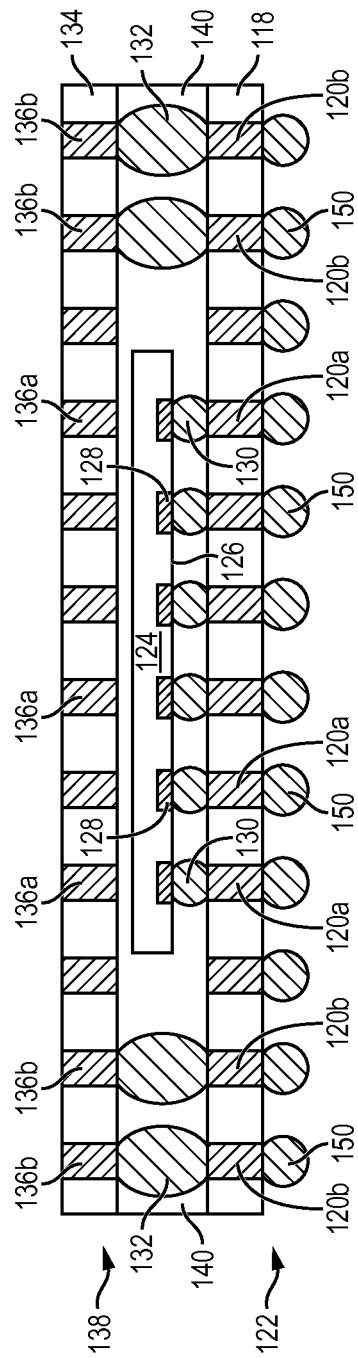

In FIG. 3h, an electrically conductive bump material is deposited over conductive vias 120 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive vias 120 using a suitable attachment or bonding process. In one embodiment, the bump material is reflowed by heating the material above its melting point to form spherical balls or bumps 150. In some applications, bumps 150 are reflowed a second time to improve electrical contact to conductive vias 120. The bumps can also be compression bonded to conductive vias 120. Bumps 150 represent one type of interconnect structure that can be formed over conductive vias 120. The interconnect structure can also use stud bump, micro bump, or other electrical interconnect.

Figure 3I:
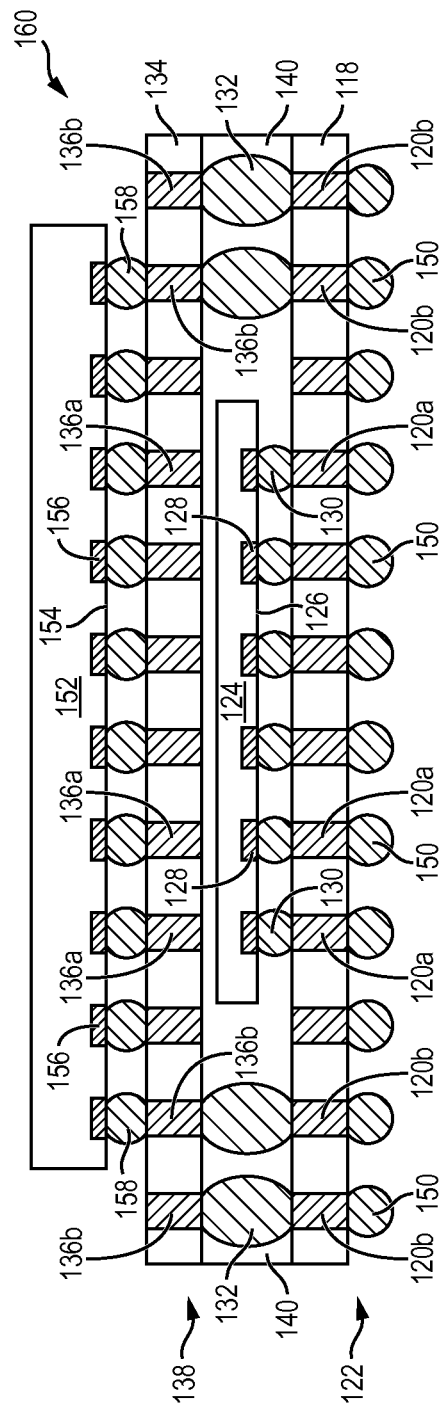

In FIG. 3i, semiconductor die 152 has an active surface 154 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 154 to implement analog circuits or digital circuits, such as DSP, ASIC, memory, or other signal processing circuit. Semiconductor die 152 may also contain IPDs, such as inductors, capacitors, and resistors, for RF signal processing. Contact pads 156 are formed in active surface 154 and electrically connected to the circuits on the active surface. Bumps 158 are formed over contact pads 156. In one embodiment, semiconductor die 152 is a flipchip type semiconductor die. Alternatively, semiconductor die 152 can be a wire-bond die. Semiconductor die 152 is mounted over TSV interposer 138 with bumps 158 metallurgically and electrically connected to conductive vias 136.

TSV interposers 122 and 138 are singulated with a saw blade or laser cutting tool into individual WLP 160. Within WLP 160, semiconductor die 124 is electrically connected to TSV interposers 122 and 138 and bumps 132. Likewise, semiconductor die 152 is electrically connected to TSV interposers 122 and 138 and bumps 158. Semiconductor die 124 is sandwiched between TSV interposers 122 and 138 for a thin structure with efficient z-direction vertical interconnect having a fine pitch and high I/O count. Penetrable encapsulant 140 provides a simple technique of sealing semiconductor die 124 with a heat dissipating feature. In addition, IPDs can be formed over or within TSV interposers 122 and 138.

Figure 4:
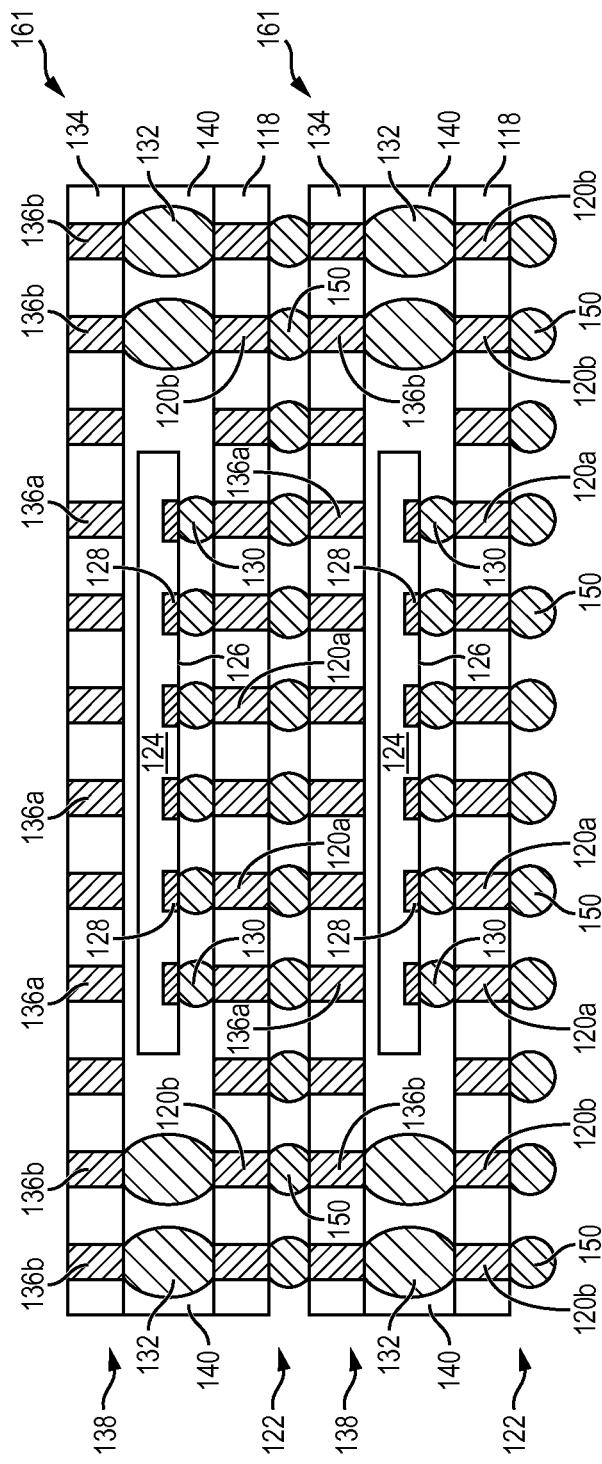
FIG. 4 illustrates two stacked WLP each with a semiconductor die embedded within a penetrable encapsulant between TSV interposers.

FIG. 4 shows two stacked WLP 161, taken from FIG. 3h, electrically connect through TSV interposers 122 and 138 and bumps 132 and 150.

Figure 5A:
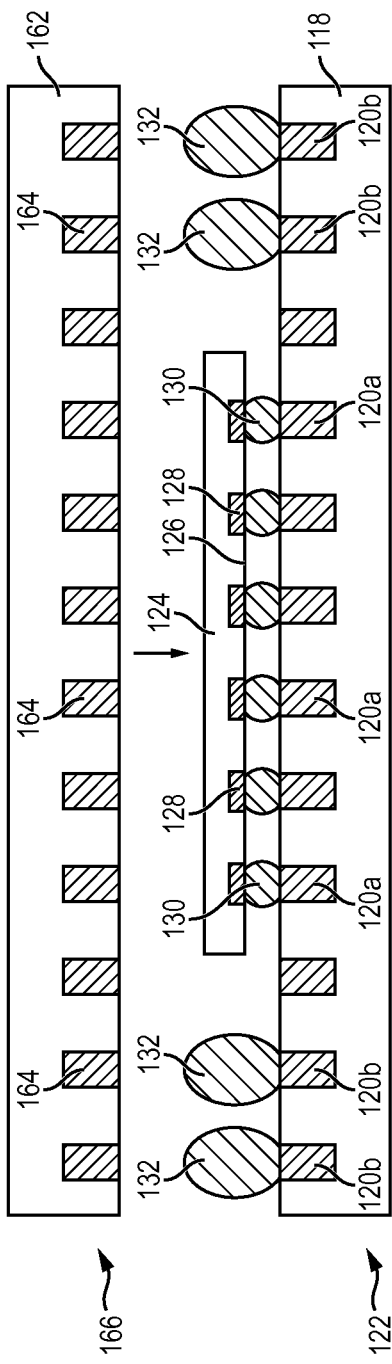
FIGS. 5a-5f illustrate another process of forming a semiconductor die embedded within a curable encapsulant between TSV interposers.

FIGS. 5a-5f illustrate, in relation to FIGS. 1 and 2a-2c, another process of forming a WLP with a semiconductor die embedded within a curable encapsulant between TSV interposers. Continuing from FIG. 3c, a semiconductor wafer or substrate 162 containing a base material, such as silicon, germanium, gallium arsenide, indium phosphide, or silicon carbide, for structural support, as shown in FIG. 5a. A plurality of vias is formed partially through substrate 162 using laser drilling, mechanical drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect blind conductive vias 164. In another embodiment, conductive vias are formed completely through substrate 162. Substrate 162 with conductive vias 164 constitutes a TSV interposer 166. Bumps 132 can be formed over conductive vias 164b instead of conductive vias 120b.

Leading with blind conductive vias 164, TSV interposer 166 is placed over and mounted to TSV interposer 122 and semiconductor die 124 with bumps 132 contacting conductive vias 164b. A curable encapsulant 170 is injected into the open space between TSV interposers 122 and 166. Curable encapsulant 170 covers semiconductor die 124 and bumps 132. Curable encapsulant 170 contains B-stage curable material or polymer material, such as an epoxy resin. Curable encapsulant 140 may also contain a particulate filler to exhibit thermally conductive properties for heat dissipation from semiconductor die 124. The particulate filler includes materials such as silica, aluminum nitride, carbon black, alumina, aluminum, or other similar metals.

Figure 5B:
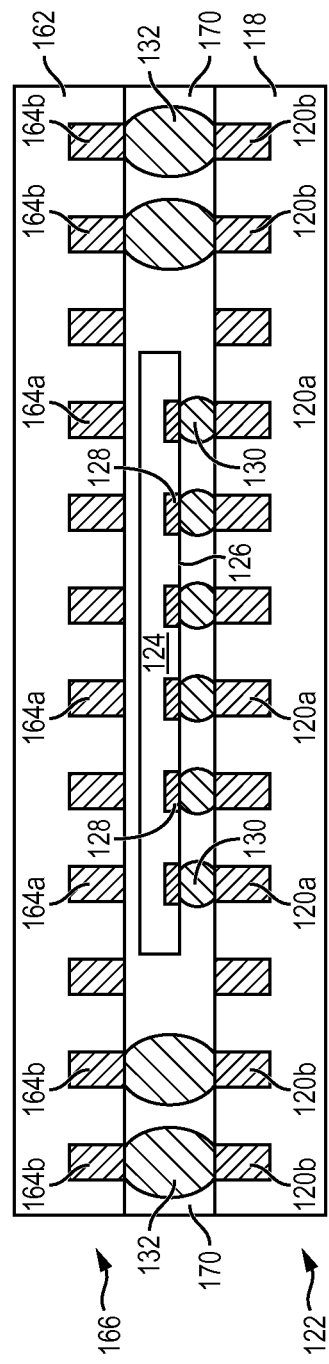

FIG. 5b shows semiconductor die 124 and bumps 132 embedded within curable encapsulant 170. The encapsulant 170 is cured at 175-185° C. for a duration of 70-120 seconds, to harden the material and securely hold semiconductor die 124 and bumps 132. The elevated temperature also serves to metallurgically and electrically connect bumps 130 to conductive vias 120a and bumps 132 to conductive vias 120b and 164b.

Figure 5C:
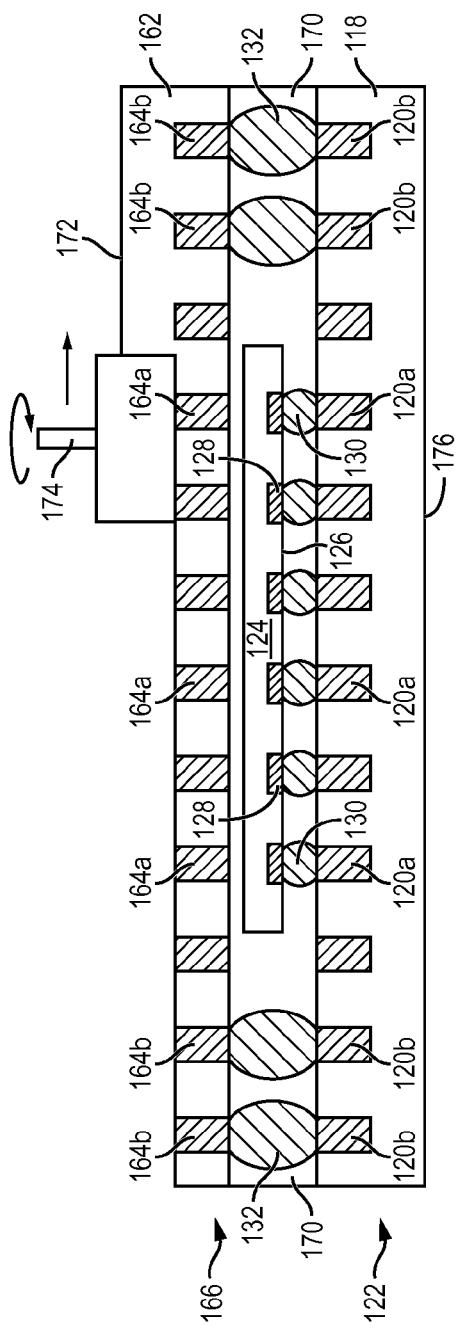
Figure 5D:
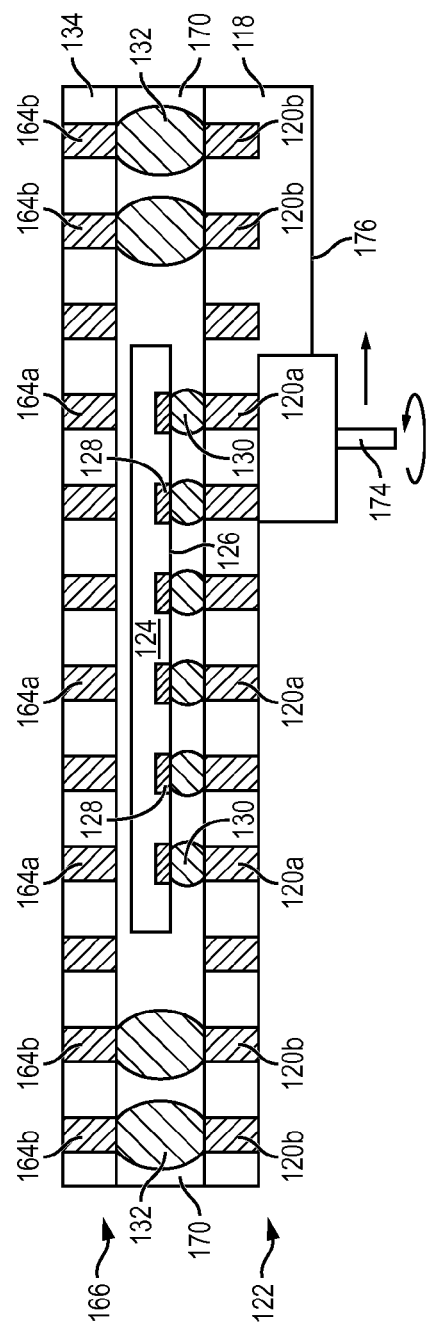

In the case of blind conductive vias 164, a portion of surface 172 of TSV interposer 166 is removed by grinder 174 to expose conductive vias 164, as shown in FIG. 5c. In the case of blind conductive vias 120, a portion of surface 176 of TSV interposer 122 is removed by grinder 174 to expose conductive vias 120, as shown in FIG. 5d. Following the grinding operations, conductive vias 120 are electrically isolated from each other and conductive vias 164 are electrically isolated from each other. The grinding operations also reduce the thickness of TSV interposers 122 and 166.

Figure 5E:
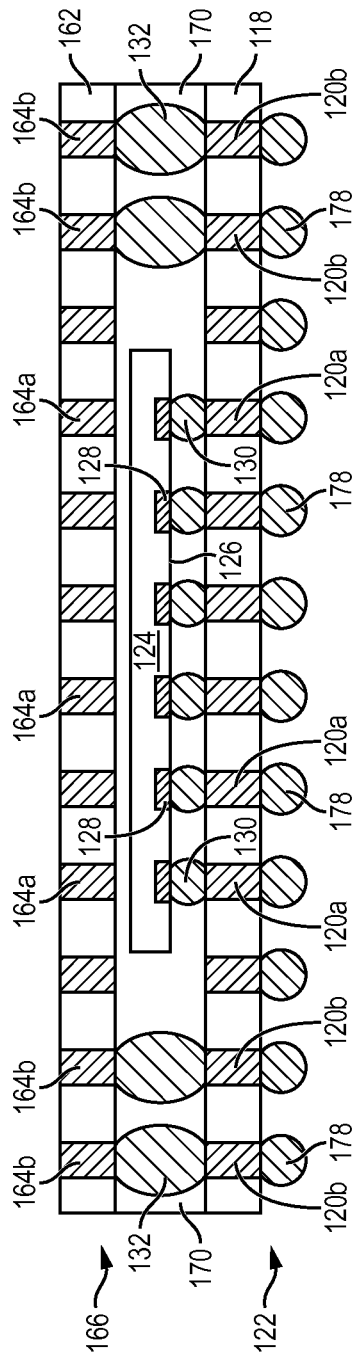

In FIG. 5e, an electrically conductive bump material is deposited over conductive vias 120 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive vias 120 using a suitable attachment or bonding process. In one embodiment, the bump material is reflowed by heating the material above its melting point to form spherical balls or bumps 178. In some applications, bumps 178 are reflowed a second time to improve electrical contact to conductive vias 120. The bumps can also be compression bonded to conductive vias 120. Bumps 178 represent one type of interconnect structure that can be formed over conductive vias 120. The interconnect structure can also use stud bump, micro bump, or other electrical interconnect.

Figure 5F:
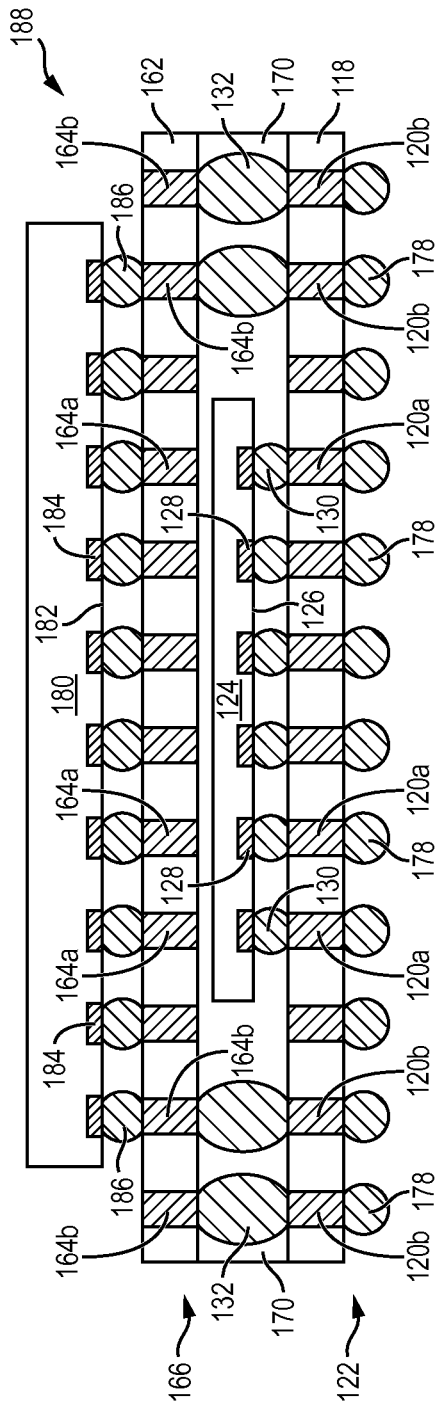

In FIG. 5f, semiconductor die 180 has an active surface 182 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 182 to implement analog circuits or digital circuits, such as DSP, ASIC, memory, or other signal processing circuit. Semiconductor die 180 may also contain IPDs, such as inductors, capacitors, and resistors, for RF signal processing. Contact pads 184 are formed in active surface 182 and electrically connected to the circuits on the active surface. Bumps 186 are formed over contact pads 184. In one embodiment, semiconductor die 180 is a flipchip type semiconductor die. Alternatively, semiconductor die 180 can be a wire-bond die. Semiconductor die 180 is mounted over TSV interposer 166 with bumps 186 metallurgically and electrically connected to conductive vias 164.

TSV interposers 122 and 166 are singulated with a saw blade or laser cutting tool into individual WLP 188. Within WLP 188, semiconductor die 124 is electrically connected to TSV interposers 122 and 166 and bumps 132. Likewise, semiconductor die 180 is electrically connected to TSV interposers 122 and 166 and bumps 132. Semiconductor die 124 is sandwiched between TSV interposers 122 and 166 for a thin structure with efficient z-direction vertical interconnect having a fine pitch and high I/O count. In addition, IPDs can be formed over or within TSV interposers 122 and 166.

Figure 6:
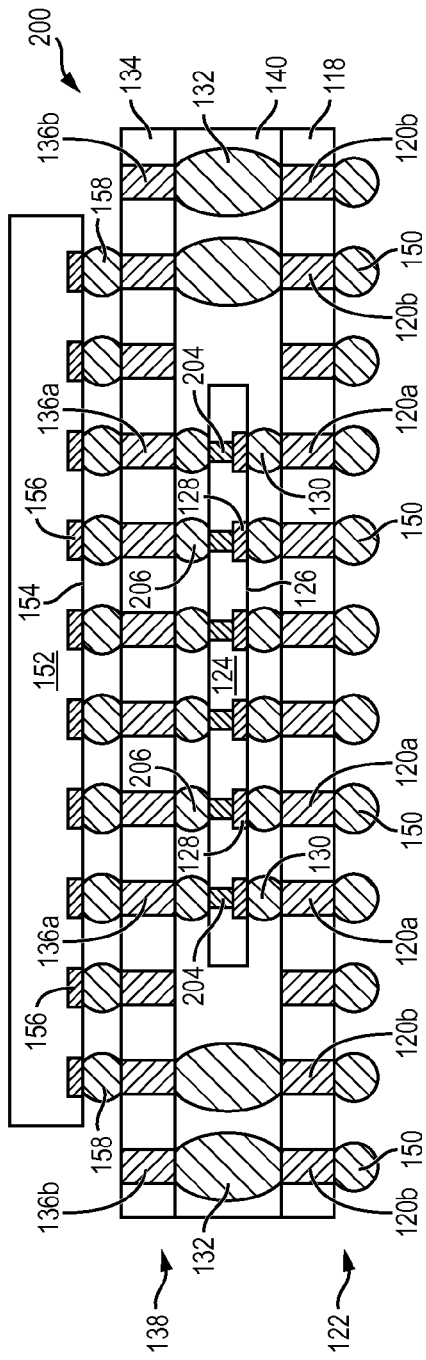
FIG. 6 illustrates conductive TSV formed through the semiconductor die.

FIG. 6 shows an embodiment of WLP 200, similar to FIG. 3i, with conductive TSV 204 formed through semiconductor die 124. A plurality of vias is formed in semiconductor die 124 while in wafer form using laser drilling, mechanical drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical conductive TSV 204 for additional electrical interconnect. Bumps 206 are formed over conductive TSV 204 for electrical interconnect to conductive vias 136a.

Figure 7:
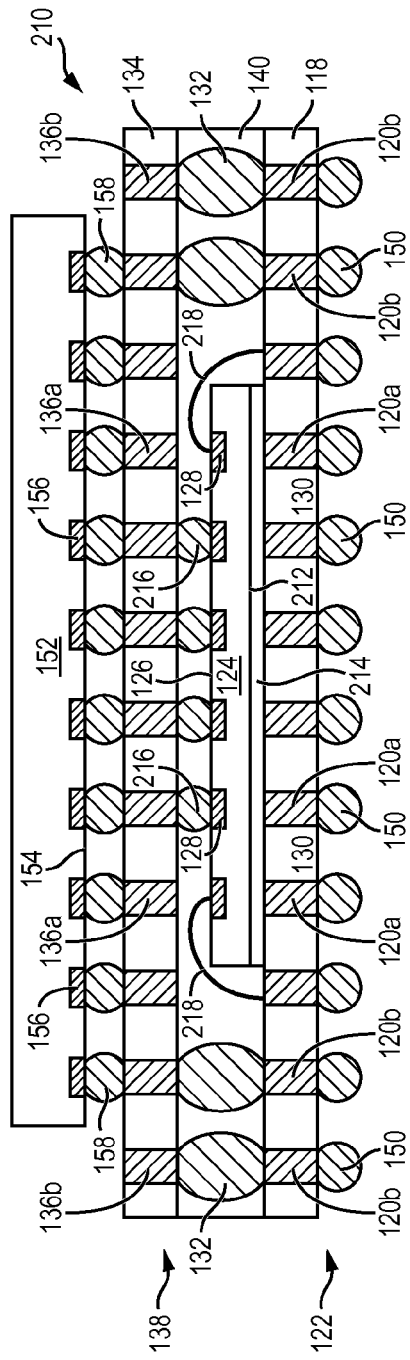
FIG. 7 illustrates the semiconductor die interconnected with bond wires and bumps.

FIG. 7 shows an embodiment of WLP 210, similar to FIG. 3i, with semiconductor die 124 mounted back surface 212 to TSV interposer 122 with die attach adhesive 214. Contact pads 128 of semiconductor die 124 are electrically connected to TSV interposer 138 with bumps 216. Contact pads 128 are also electrically connected to TSV interposer 122 with bond wires 218.

Figure 8:
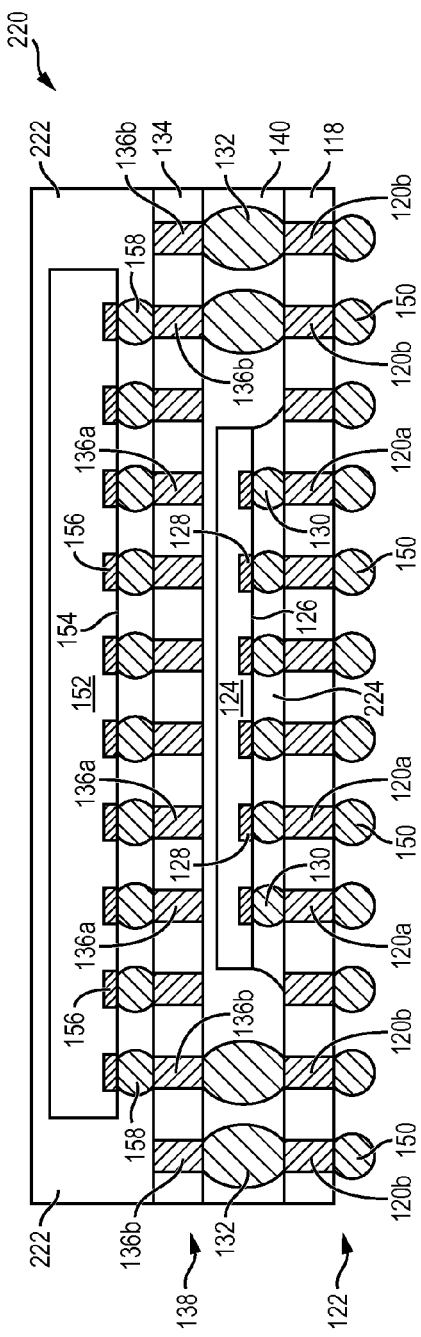
FIG. 8 illustrates an encapsulant deposited over the upper semiconductor die.

FIG. 8 shows an embodiment of WLP 220, similar to FIG. 3i, with an encapsulant or molding compound 222 deposited over TSV interposer 138 and semiconductor die 152 using a paste printing, compressive molding, transfer molding, liquid encapsulant molding, vacuum lamination, spin coating, or other suitable applicator. Encapsulant 222 can be polymer composite material, such as epoxy resin with filler, epoxy acrylate with filler, or polymer with proper filler. Encapsulant 222 is non-conductive and environmentally protects the semiconductor device from external elements and contaminants. An underfill material 224 can be deposited under semiconductor die 124 prior to mounting TSV interposer 138 and embedding semiconductor die 124 and bumps 132 in penetrable encapsulant 140.

Figure 9:
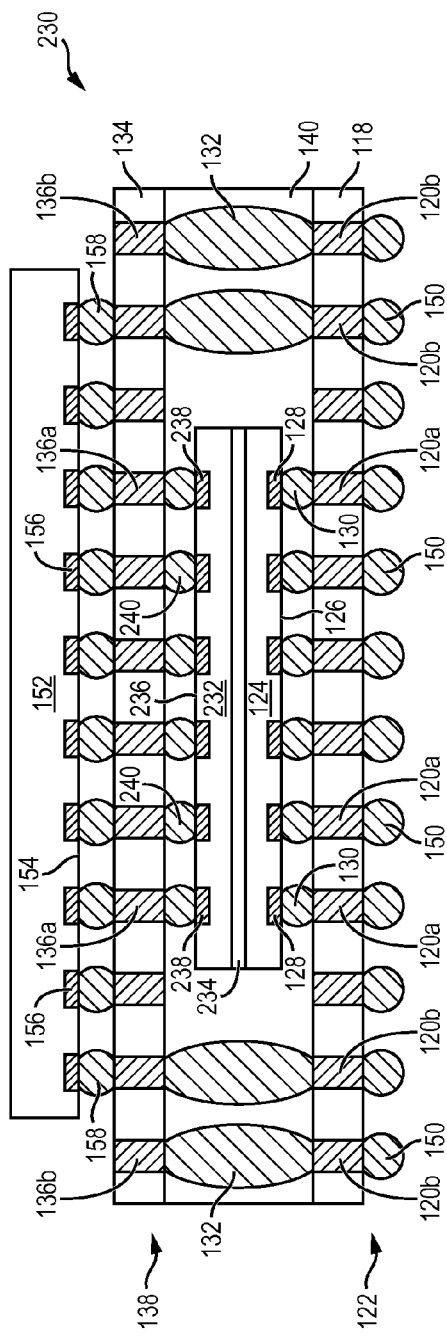
FIG. 9 illustrates stacked semiconductor die embedded within a penetrable encapsulant between TSV interposers.

FIG. 9 shows an embodiment of WLP 230, similar to FIG. 3i, with semiconductor die 232 mounted back surface-to-back surface to semiconductor die 124 with die attach adhesive 234 prior to mounting TSV interposer 138 and embedding semiconductor die 124 and interconnect structure 132 in penetrable encapsulant 140. Semiconductor die 232 has an active surface 236 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 236 to implement analog circuits or digital circuits, such as DSP, ASIC, memory, or other signal processing circuit. Semiconductor die 232 may also contain IPDs, such as inductors, capacitors, and resistors, for RF signal processing. Contact pads 238 are formed in active surface 236 and electrically connected to the circuits on the active surface. Bumps 240 are formed over contact pads 238. In one embodiment, semiconductor die 232 is a flipchip type semiconductor die. Alternatively, semiconductor die 232 can be a wire-bond die or internal stacking module. Due to the height of stack semiconductor die 124 and 232, interconnect structure 132 can be conductive pillars or stacked bumps to span the distance between TSV interposer 122 and 138. After mounting TSV interposer 138 and penetrable encapsulant 140, bumps 240 are electrically connected to conductive vias 136a.

Figure 10A:
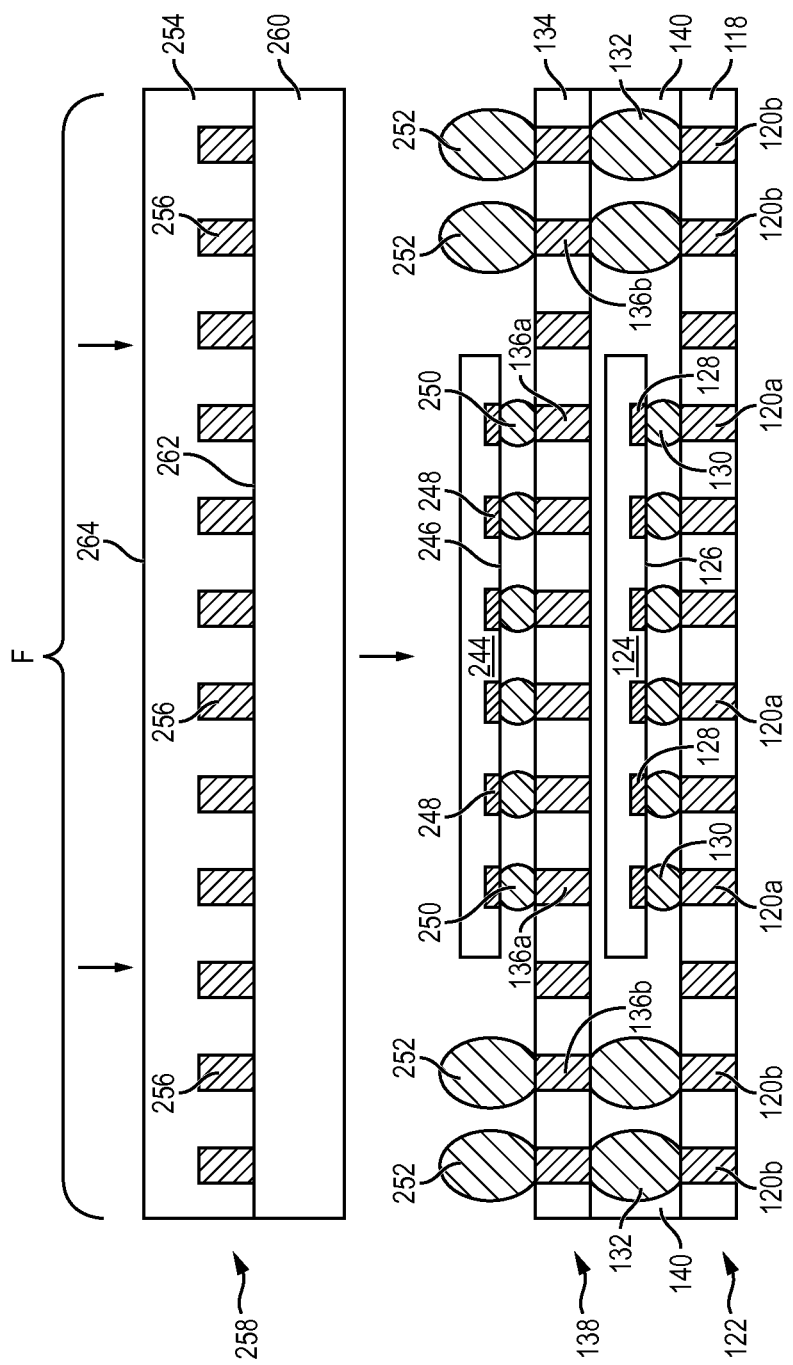
FIGS. 10a-10c illustrate a process of forming multiple layers of semiconductor die embedded within a penetrable encapsulant between TSV interposers.
Figure 10B:
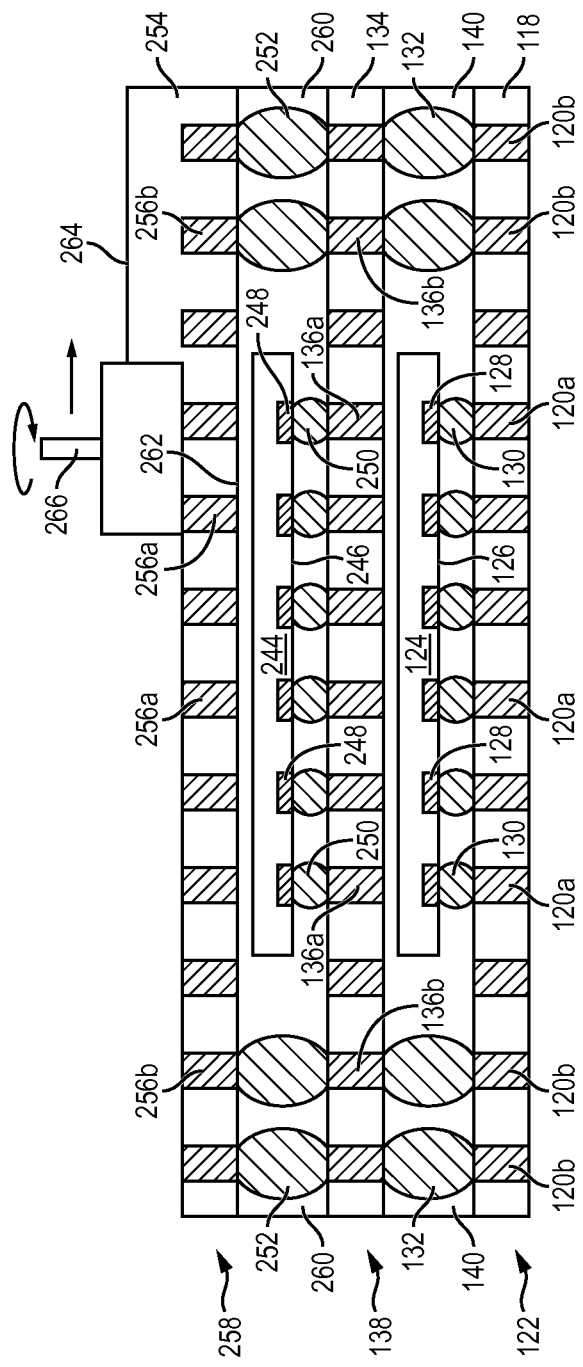
Figure 10C:
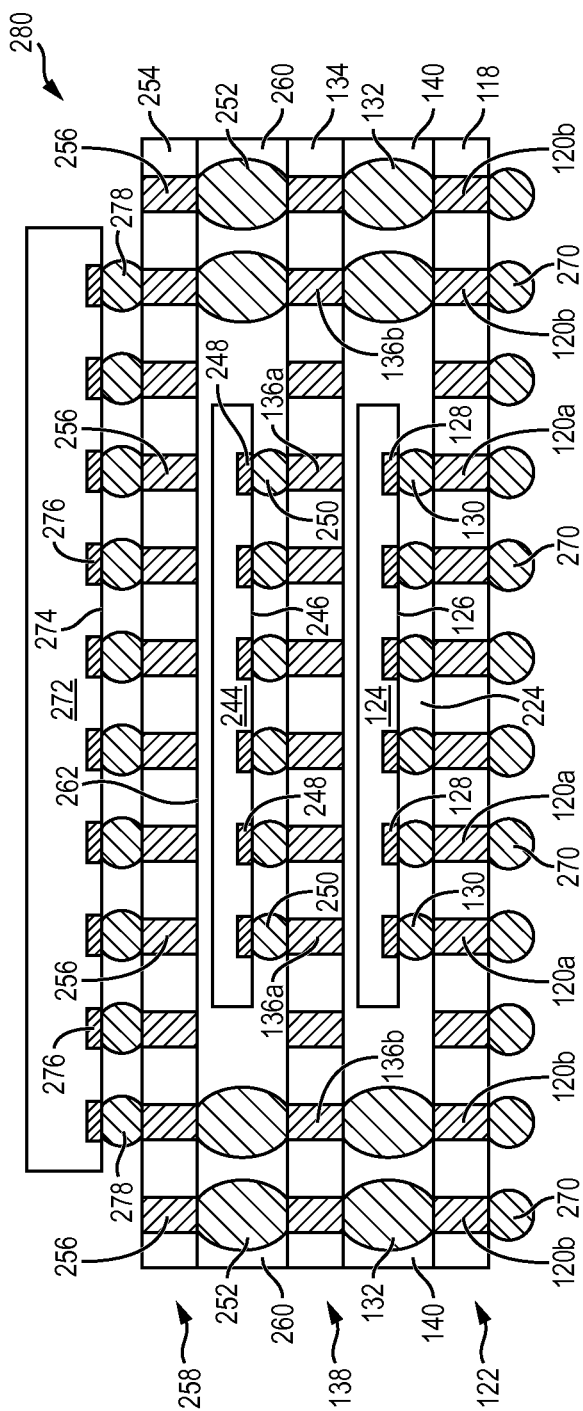

FIGS. 10a-10c show an embodiment of forming multiple layers of TSV interposers and semiconductor die embedded within the penetrable encapsulant. Continuing from FIG. 3g, semiconductor die 244 has an active surface 246 containing analog or digital circuits implemented as active devices, passive devices, conductive layers, and dielectric layers formed within the die and electrically interconnected according to the electrical design and function of the die, as shown in FIG. 10a. For example, the circuit may include one or more transistors, diodes, and other circuit elements formed within active surface 246 to implement analog circuits or digital circuits, such as DSP, ASIC, memory, or other signal processing circuit. Semiconductor die 244 may also contain IPDs, such as inductors, capacitors, and resistors, for RF signal processing. Contact pads 248 are formed in active surface 246 and electrically connected to the circuits on the active surface. Bumps 250 are formed over contact pads 248. In one embodiment, semiconductor die 244 is a flipchip type semiconductor die. Alternatively, semiconductor die 244 can be a wire-bond die.

FIG. 10a shows a portion of TSV interposer 138 associated with one semiconductor die. TSV interposer 138 extends beyond the dimensions shown in FIG. 3b for a wafer level multi-die attachment. Semiconductor die 244 is mounted over TSV interposer 138 with bumps 250 contacting conductive vias 136a.

An electrically conductive bump material is deposited over conductive vias 136b using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive vias 136b using a suitable attachment or bonding process. In one embodiment, the bump material is reflowed by heating the material above its melting point to form spherical balls or bumps 252. In some applications, bumps 252 are reflowed a second time to improve electrical contact to conductive vias 136b. The bumps can also be compression bonded to conductive vias 136b. Bumps 252 represent one type of interconnect structure that can be formed over conductive vias 136b. The interconnect structure can also use conductive pillars, stacked bumps, or other electrical interconnect.

A semiconductor wafer or substrate 254 contains a base material, such as silicon, germanium, gallium arsenide, indium phosphide, or silicon carbide, for structural support. A plurality of vias is formed partially through substrate 254 using laser drilling, mechanical drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect blind conductive vias 256. In another embodiment, conductive vias are formed completely through substrate 254. Substrate 254 with conductive vias 256 constitutes a TSV interposer 258.

A penetrable encapsulant or adhesive layer 260 is deposited or otherwise applied over surface 262 of TSV interposer 258. In one embodiment, a B-stage curable encapsulant is deposited over surface 262 using spin coating or screen printing with a thickness greater than a height of semiconductor die 244 or bumps 252. Penetrable encapsulant 260 can also be a polymer material, such as an epoxy resin. Penetrable encapsulant 260 may contain a particulate filler to exhibit thermally conductive properties for heat dissipation from semiconductor die 244. The particulate filler includes materials such as silica, aluminum nitride, carbon black, alumina, aluminum, or other similar metals.

Leading with penetrable encapsulant 260, TSV interposer 258 is placed over and mounted to TSV interposer 138, semiconductor die 244, and bumps 252. A force F is applied to surface 264 of TSV interposer 258, opposite surface 262, to envelop semiconductor die 244 and bumps 252 with penetrable encapsulant 260. The requisite force F is about 1 MPa. The force F is removed after penetrable encapsulant 260 comes into close proximity or touches TSV interposer 138 and bumps 252 come into close proximity or touch conductive vias 256. The requisite force to envelop semiconductor die 244 and bumps 252 with penetrable encapsulant 260 can be achieved in a vacuum.

FIG. 10b shows semiconductor die 244 and bumps 252 embedded within penetrable encapsulant 260. The penetrable encapsulant 260 is cured at 75° C. for a duration of 10-30 seconds, and remains at 175° C. after cure for 60 minutes, to harden the material and securely hold semiconductor die 244 and bumps 252. The elevated temperature also serves to metallurgically and electrically connect bumps 250 to conductive vias 136a and bumps 252 to conductive vias 136b and 256b.

In the case of blind conductive vias 256, a portion of surface 264 of TSV interposer 258 is removed by grinder 266 to expose conductive vias 256. Following the grinding operations, conductive vias 256 are electrically isolated from each other. The grinding operations also reduce the thickness of TSV interposer 258.

In FIG. 10c, an electrically conductive bump material is deposited over conductive vias 120 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive vias 120 using a suitable attachment or bonding process. In one embodiment, the bump material is reflowed by heating the material above its melting point to form spherical balls or bumps 270. In some applications, bumps 270 are reflowed a second time to improve electrical contact to conductive vias 120. The bumps can also be compression bonded to conductive vias 120. Bumps 270 represent one type of interconnect structure that can be formed over conductive vias 120. The interconnect structure can also use stud bump, micro bump, or other electrical interconnect.

Semiconductor die 272 has an active surface 274 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 274 to implement analog circuits or digital circuits, such as DSP, ASIC, memory, or other signal processing circuit. Semiconductor die 272 may also contain IPDs, such as inductors, capacitors, and resistors, for RF signal processing. Contact pads 276 are formed in active surface 274 and electrically connected to the circuits on the active surface. Bumps 278 are formed over contact pads 276. In one embodiment, semiconductor die 272 is a flipchip type semiconductor die. Alternatively, semiconductor die 272 can be a wire-bond die. Semiconductor die 272 is mounted over TSV interposer 258 with bumps 278 metallurgically and electrically connected to conductive vias 256.

TSV interposers 122, 138, and 258 are singulated with a saw blade or laser cutting tool into individual WLP 280. Within WLP 280, semiconductor die 124 is electrically connected to TSV interposers 122, 138, and 258, and bumps 132 and 252. Semiconductor die 244 is electrically connected to TSV interposers 122, 138, and 258, and bumps 132 and 252. Semiconductor die 272 is electrically connected to TSV interposers 122, 138, and 258, and bumps 132 and 252. Semiconductor die 124 is sandwiched between TSV interposers 122 and 138 for a thin structure with efficient z-direction vertical interconnect having a fine pitch and high I/O count. Semiconductor die 244 is sandwiched between TSV interposers 138 and 258 for a thin structure with efficient z-direction vertical interconnect having a fine pitch and high I/O count. Penetrable encapsulant 140 and 250 provide a simple technique of sealing semiconductor die 124 and 244 with a heat dissipating feature.

Figure 11F:
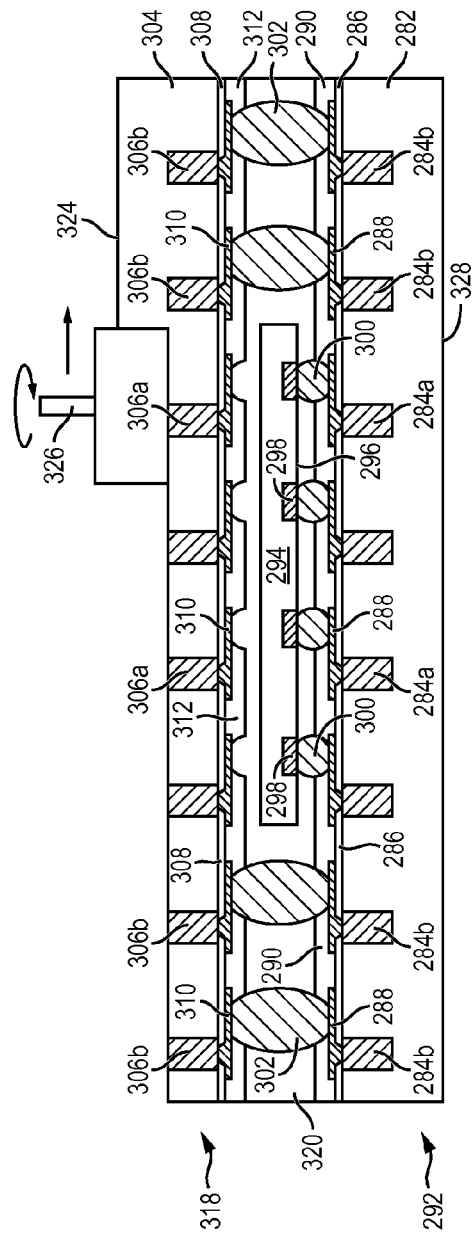

FIGS. 11a-11i illustrate, in relation to FIGS. 1 and 2a-2c, another process of forming a WLP with a semiconductor die embedded within a penetrable encapsulant between TSV interposers having a RDL structure. FIG. 11a shows a semiconductor wafer or substrate 282 containing a base material, such as silicon, germanium, gallium arsenide, indium phosphide, or silicon carbide, for structural support. A plurality of vias is formed partially through substrate 282 using laser drilling, mechanical drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect blind conductive vias 284. In another embodiment, conductive vias are formed completely through substrate 282.

An insulating or passivation layer 286 is formed over substrate 282 and conductive vias 284 using PVD, CVD, printing, spin coating, spray coating, sintering or thermal oxidation. The insulating layer 286 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 286 is removed by an etching process to expose conductive vias 284.

An electrically conductive layer or redistribution layer (RDL) 288 is formed over insulating layer 286 and the exposed conductive vias 284 using a patterning and metal deposition process such as printing, PVD, CVD, sputtering, electrolytic plating, and electroless plating. Conductive layer 288 can be one or more layers of Al, Cu, Sn, Ni, Au, Ag, or other suitable electrically conductive material. Conductive layer 288 is electrically connected to conductive vias 284 and reroutes or extends lateral connectivity of the conductive vias.

An insulating or photoresist layer 290 is formed over insulating layer 286 and conductive layer 288 using PVD, CVD, printing, spin coating, spray coating, sintering or thermal oxidation. A portion of insulating layer 290 is removed by an etching process to expose a portion of conductive layer 288 laterally offset from conductive vias 284 for additional electrical interconnect. Substrate 282 with conductive vias 284, insulating layers 286 and 290, and conductive layer 288 constitute a TSV interposer 292 with an RDL structure.

In FIG. 11b, semiconductor die 294 has an active surface 296 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 296 to implement analog circuits or digital circuits, such as DSP, ASIC, memory, or other signal processing circuit. Semiconductor die 294 may also contain IPDs, such as inductors, capacitors, and resistors, for RF signal processing. Contact pads 298 are formed in active surface 296 and electrically connected to the circuits on the active surface. Bumps 300 are formed over contact pads 298. In one embodiment, semiconductor die 294 is a flipchip type semiconductor die. Alternatively, semiconductor die 294 can be a wire-bond die. FIG. 11b shows a portion of TSV interposer 292 associated with one semiconductor die. TSV interposer 292 extends beyond the dimensions shown in FIG. 11b for a wafer-level multi-die attachment.

In FIG. 11c, semiconductor die 294 is mounted over TSV interposer 292 with bumps 300 contacting conductive layer 288. An electrically conductive bump material is deposited over conductive layer 288 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 288 using a suitable attachment or bonding process. In one embodiment, the bump material is reflowed by heating the material above its melting point to form spherical balls or bumps 302. In some applications, bumps 302 are reflowed a second time to improve electrical contact to conductive layer 288. The bumps can also be compression bonded to conductive layer 288. Bumps 302 represent one type of interconnect structure that can be formed over conductive layer 288. The interconnect structure can also use conductive pillars, stacked bumps, or other electrical interconnect.

FIG. 11d shows a semiconductor wafer or substrate 304 containing a base material, such as silicon, germanium, gallium arsenide, indium phosphide, or silicon carbide, for structural support. A plurality of vias is formed partially through substrate 304 using laser drilling, mechanical drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect blind conductive vias 306. In another embodiment, conductive vias are formed completely through substrate 304.

An insulating or passivation layer 308 is formed over substrate 304 and conductive vias 306 using PVD, CVD, printing, spin coating, spray coating, sintering or thermal oxidation. The insulating layer 308 contains one or more layers of SiO2, Si3N4, SiON, Ta2O5, Al2O3, or other material having similar insulating and structural properties. A portion of insulating layer 308 is removed by an etching process to expose conductive vias 306.

An electrically conductive layer or RDL 310 is formed over insulating layer 308 and the exposed conductive vias 306 using a patterning and metal deposition process such as printing, PVD, CVD, sputtering, electrolytic plating, and electroless plating. Conductive layer 310 can be one or more layers of Al, Cu, Sn, Ni, Au, Ag, or other suitable electrically conductive material. Conductive layer 310 is electrically connected to conductive vias 306 and reroutes or extends lateral connectivity of the conductive vias.

An insulating or photoresist layer 312 is formed over insulating layer 308 and conductive layer 310 using PVD, CVD, printing, spin coating, spray coating, sintering or thermal oxidation. A portion of insulating layer 312 is removed by an etching process to expose a portion of conductive layer 310 laterally offset from conductive vias 306 for additional electrical interconnect. Substrate 304 with conductive vias 306, insulating layers 308 and 312, and conductive layer 310 constitute a TSV interposer 318 with an RDL structure.

A penetrable encapsulant or adhesive layer 320 is deposited or otherwise applied over conductive layer 310 and insulating layer 312 of TSV interposer 318. In one embodiment, a B-stage curable encapsulant is deposited over conductive layer 310 and insulating layer 312 using spin coating or screen printing with a thickness greater than a height of semiconductor die 294 or bumps 302. Penetrable encapsulant 320 can also be a polymer material, such as an epoxy resin. Penetrable encapsulant 320 may contain a particulate filler to exhibit thermally conductive properties for heat dissipation from semiconductor die 294. The particulate filler includes materials such as silica, aluminum nitride, carbon black, alumina, aluminum, or other similar metals.

Leading with penetrable encapsulant 320, TSV interposer 318 is placed over and mounted to TSV interposer 292, semiconductor die 294, and bumps 302. A force F is applied to surface 324 of TSV interposer 318, opposite insulating layer 312, to envelop semiconductor die 294 and bumps 302 with penetrable encapsulant 320. The requisite force F is about 1 MPa. The force F is removed after penetrable encapsulant 320 comes into close proximity or touches TSV interposer 292 and bumps 302 come into close proximity or touch conductive layer 310. The requisite force to envelop semiconductor die 294 and bumps 302 with penetrable encapsulant 320 can be achieved in a vacuum.

FIG. 11e shows semiconductor die 294 and bumps 302 embedded within penetrable encapsulant 320. The penetrable encapsulant 320 is cured at 75° C. for a duration of 10-30 seconds, and remains at 175° C. after cure for 60 minutes, to harden the material and securely hold semiconductor die 294 and bumps 302. The elevated temperature also serves to metallurgically and electrically connect bumps 300 to conductive layer 288 and bumps 302 to conductive layers 288 and 310.

Figure 11G:
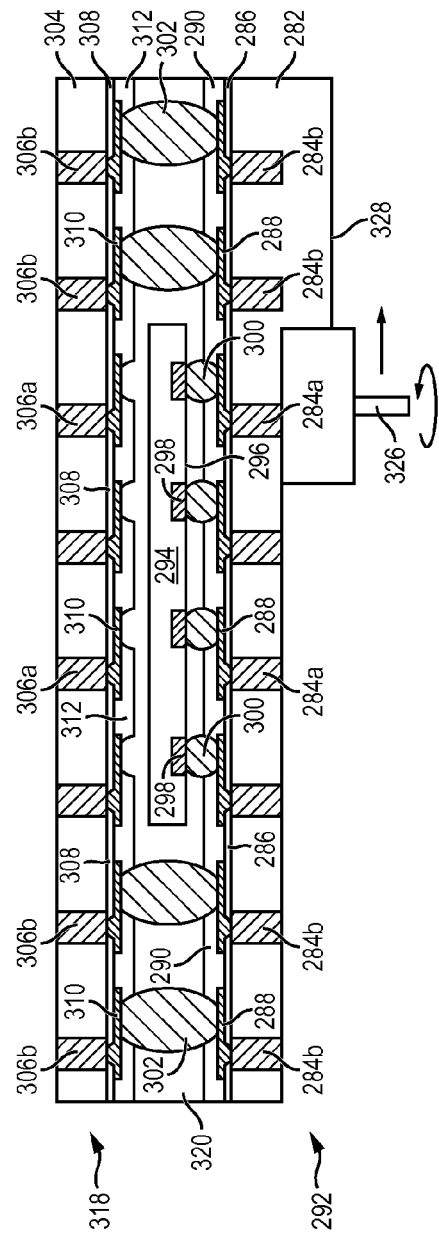

In the case of blind conductive vias 306, a portion of surface 324 of TSV interposer 318 is removed by grinder 326 to expose conductive vias 306, as shown in FIG. 11f. Likewise, in the case of blind conductive vias 284, a portion of surface 328 of TSV interposer 292 is removed by grinder 326 to expose conductive vias 284, as shown in FIG. 11g. The grinding operations also reduce the thickness of TSV interposers 292 and 318.

Figure 11H:
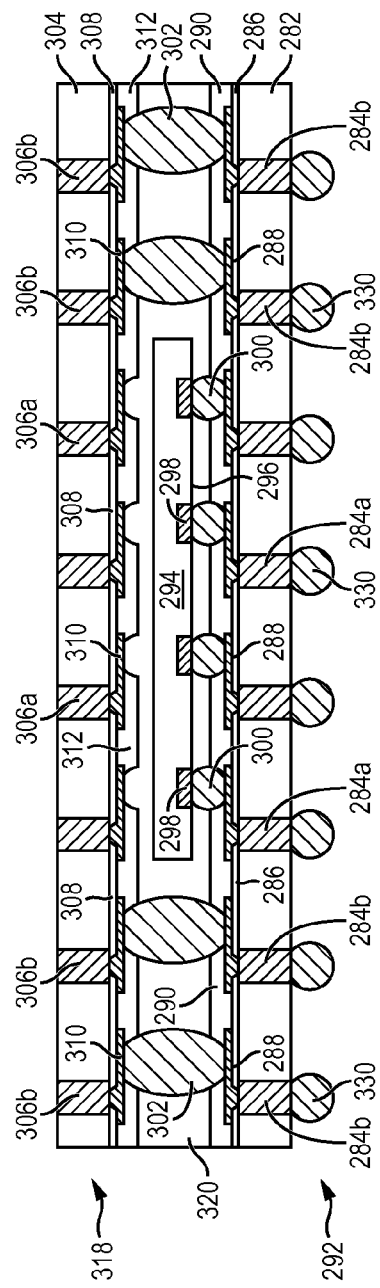

In FIG. 11h, an electrically conductive bump material is deposited over conductive vias 284 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive vias 284 using a suitable attachment or bonding process. In one embodiment, the bump material is reflowed by heating the material above its melting point to form spherical balls or bumps 330. In some applications, bumps 330 are reflowed a second time to improve electrical contact to conductive vias 284. The bumps can also be compression bonded to conductive vias 284. Bumps 330 represent one type of interconnect structure that can be formed over conductive vias 284. The interconnect structure can also use stud bump, micro bump, or other electrical interconnect.

Figure 11I:
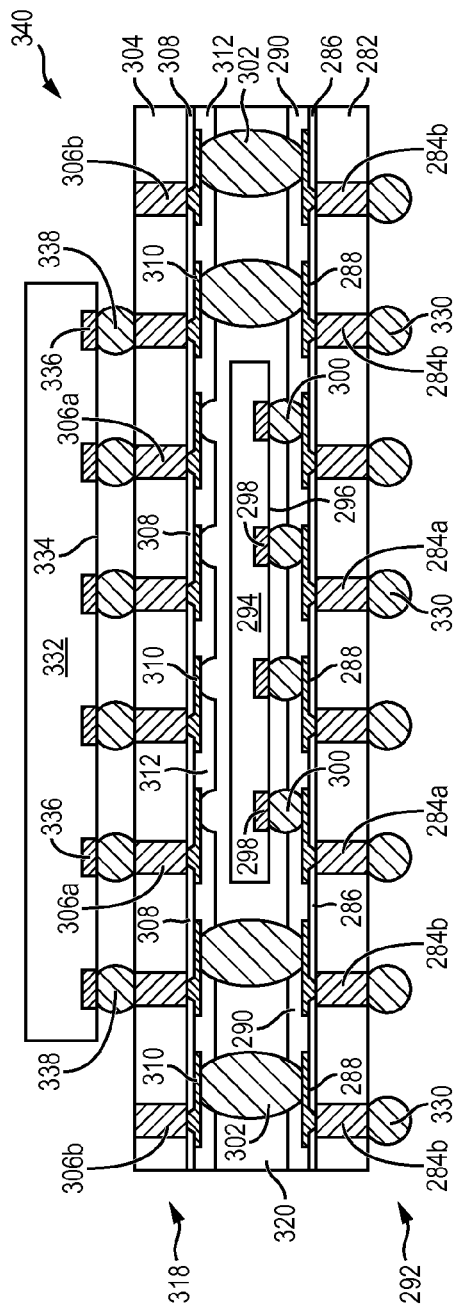

In FIG. 11i, semiconductor die 332 has an active surface 334 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 334 to implement analog circuits or digital circuits, such as DSP, ASIC, memory, or other signal processing circuit. Semiconductor die 332 may also contain IPDs, such as inductors, capacitors, and resistors, for RF signal processing. Contact pads 336 are formed in active surface 334 and electrically connected to the circuits on the active surface. Bumps 338 are formed over contact pads 336. In one embodiment, semiconductor die 332 is a flipchip type semiconductor die. Alternatively, semiconductor die 332 can be a wire-bond die. Semiconductor die 332 is mounted over TSV interposer 318 with bumps 338 metallurgically and electrically connected to conductive vias 306.

TSV interposers 292 and 318 are singulated with a saw blade or laser cutting tool into individual WLP 340. Within WLP 340, semiconductor die 294 is electrically connected to TSV interposers 292 and 318, RDLs 288 and 310, and bumps 302. Likewise, semiconductor die 332 is electrically connected to TSV interposers 292 and 318, RDLs 288 and 310, and bumps 302. Semiconductor die 294 is sandwiched between TSV interposers 292 and 318 for a thin structure with efficient z-direction vertical interconnect having a fine pitch and high I/O count. Penetrable encapsulant 320 provides a simple technique of sealing semiconductor die 294 with a heat dissipating feature.

Figure 12A:
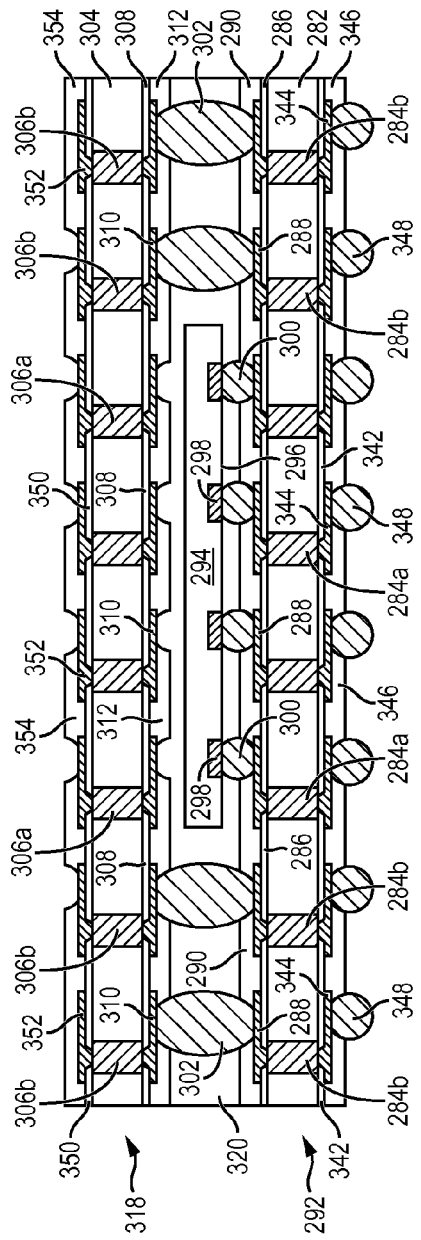
FIGS. 12a-12b illustrate a process of forming a semiconductor die embedded within a penetrable encapsulant between TSV interposers with a second RDL structure.

FIG. 12a shows another embodiment, continuing from FIG. 11g, with an insulating or passivation layer 342 formed over substrate 282 and conductive vias 284 using PVD, CVD, printing, spin coating, spray coating, sintering or thermal oxidation. The insulating layer 342 contains one or more layers of SiO2, Si3N4, SiON, Ta2O5, Al2O3, or other material having similar insulating and structural properties. A portion of insulating layer 342 is removed by an etching process to expose conductive vias 284.

An electrically conductive layer or RDL 344 is formed over insulating layer 342 and the exposed conductive vias 284 using a patterning and metal deposition process such as printing, PVD, CVD, sputtering, electrolytic plating, and electroless plating. Conductive layer 344 can be one or more layers of Al, Cu, Sn, Ni, Au, Ag, or other suitable electrically conductive material. Conductive layer 344 is electrically connected to conductive vias 284 and reroutes or extends lateral connectivity of the conductive vias.

An insulating or photoresist layer 346 is formed over insulating layer 342 and conductive layer 344 using PVD, CVD, printing, spin coating, spray coating, sintering or thermal oxidation. A portion of insulating layer 346 is removed by an etching process to expose a portion of conductive layer 344 laterally offset from conductive vias 284 for additional electrical interconnect.

An electrically conductive bump material is deposited over the exposed conductive layer 344 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 344 using a suitable attachment or bonding process. In one embodiment, the bump material is reflowed by heating the material above its melting point to form spherical balls or bumps 348. In some applications, bumps 348 are reflowed a second time to improve electrical contact to conductive layer 344. The bumps can also be compression bonded to conductive layer 344. Bumps 348 represent one type of interconnect structure that can be formed over conductive layer 344. The interconnect structure can also use stud bump, micro bump, or other electrical interconnect.

An insulating or passivation layer 350 is formed over substrate 304 and conductive vias 306 using PVD, CVD, printing, spin coating, spray coating, sintering or thermal oxidation. The insulating layer 350 contains one or more layers of SiO2, Si3N4, SiON, Ta2O5, Al2O3, or other material having similar insulating and structural properties. A portion of insulating layer 350 is removed by an etching process to expose conductive vias 306.

An electrically conductive layer or RDL 352 is formed over insulating layer 350 and the exposed conductive vias 306 using a patterning and metal deposition process such as printing, PVD, CVD, sputtering, electrolytic plating, and electroless plating. Conductive layer 352 can be one or more layers of Al, Cu, Sn, Ni, Au, Ag, or other suitable electrically conductive material. Conductive layer 352 is electrically connected to conductive vias 306 and reroutes or extends lateral connectivity of the conductive vias.

An insulating or photoresist layer 354 is formed over insulating layer 350 and conductive layer 352 using PVD, CVD, printing, spin coating, spray coating, sintering or thermal oxidation. A portion of insulating layer 354 is removed by an etching process to expose a portion of conductive layer 352 laterally offset from conductive vias 306 for additional electrical interconnect.

Figure 12B:
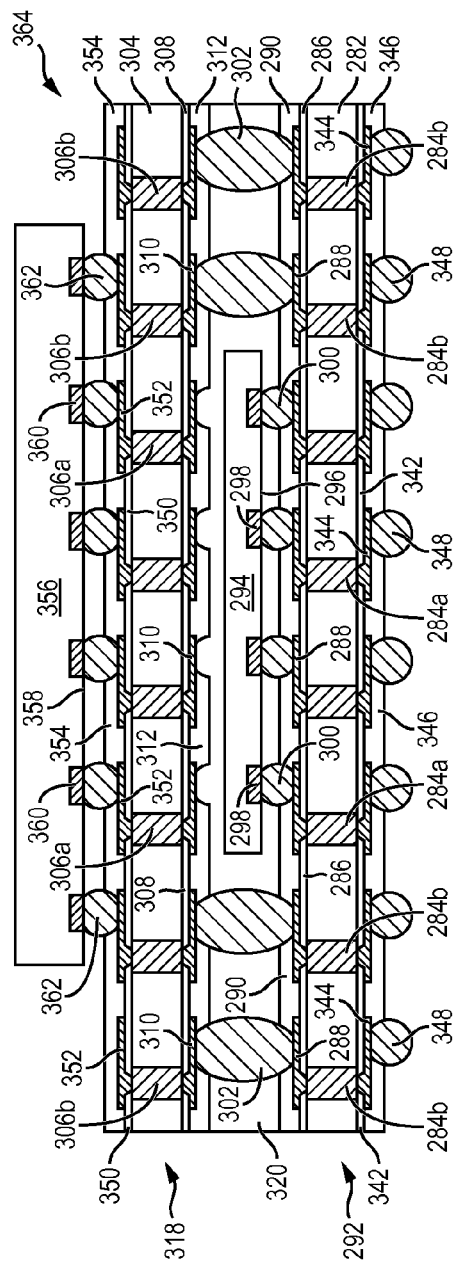

In FIG. 12b, semiconductor die 356 has an active surface 358 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 358 to implement analog circuits or digital circuits, such as DSP, ASIC, memory, or other signal processing circuit. Semiconductor die 356 may also contain IPDs, such as inductors, capacitors, and resistors, for RF signal processing. Contact pads 360 are formed in active surface 358 and electrically connected to the circuits on the active surface. Bumps 362 are formed over contact pads 360. In one embodiment, semiconductor die 356 is a flipchip type semiconductor die. Alternatively, semiconductor die 356 can be a wire-bond die. Semiconductor die 356 is mounted over TSV interposer 318 with bumps 362 metallurgically and electrically connected to conductive layer 352.

TSV interposers 292 and 318 are singulated with a saw blade or laser cutting tool into individual WLP 364. Within WLP 294, semiconductor die 294 is electrically connected to TSV interposers 292 and 318, RDLs 288, 310, 344, and 352, and bumps 302. Likewise, semiconductor die 364 is electrically connected to TSV interposers 292 and 318, RDLs 288, 310, 344, and 352, and bumps 302. Semiconductor die 294 is sandwiched between TSV interposers 292 and 318 for a thin structure with efficient z-direction vertical interconnect having a fine pitch and high I/O count. Penetrable encapsulant 320 provides a simple technique of sealing semiconductor die 294 with a heat dissipating feature.

Figure 13A:
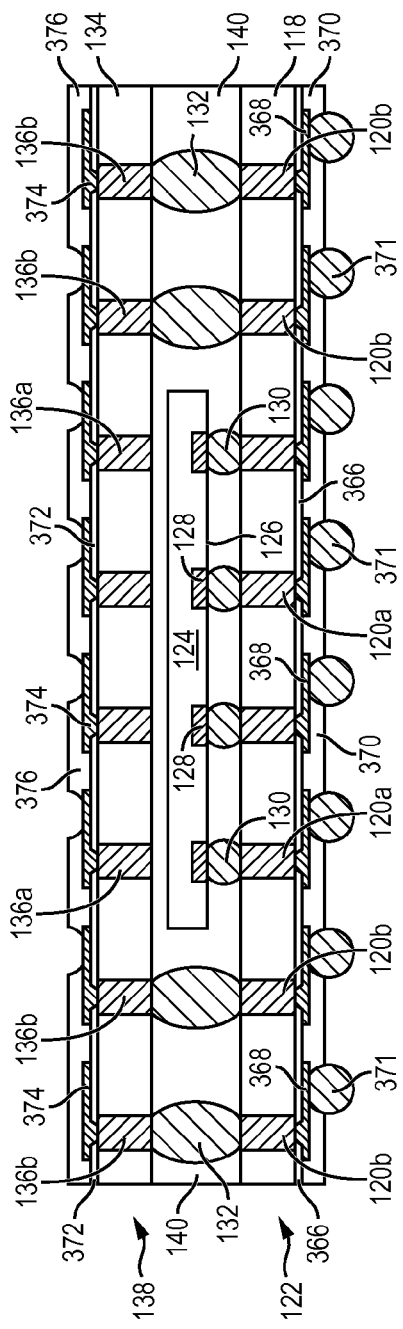
FIGS. 13a-13b illustrate a process of forming a semiconductor die embedded within a penetrable encapsulant between TSV interposers with a third RDL structure.

FIG. 13a shows another embodiment, continuing from FIG. 3g, with an insulating or passivation layer 366 formed over substrate 118 and conductive vias 120 using PVD, CVD, printing, spin coating, spray coating, sintering or thermal oxidation. The insulating layer 366 contains one or more layers of SiO2, Si3N4, SiON, Ta2O5, Al2O3, or other material having similar insulating and structural properties. A portion of insulating layer 366 is removed by an etching process to expose conductive vias 120.

An electrically conductive layer or RDL 368 is formed over insulating layer 366 and the exposed conductive vias 120 using a patterning and metal deposition process such as printing, PVD, CVD, sputtering, electrolytic plating, and electroless plating. Conductive layer 368 can be one or more layers of Al, Cu, Sn, Ni, Au, Ag, or other suitable electrically conductive material. Conductive layer 368 is electrically connected to conductive vias 120 and reroutes or extends lateral connectivity of the conductive vias.

An insulating or photoresist layer 370 is formed over insulating layer 366 and conductive layer 368 using PVD, CVD, printing, spin coating, spray coating, sintering or thermal oxidation. A portion of insulating layer 370 is removed by an etching process to expose a portion of conductive layer 368 laterally offset from conductive vias 120 for additional electrical interconnect.

An electrically conductive bump material is deposited over the exposed conductive layer 368 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 368 using a suitable attachment or bonding process. In one embodiment, the bump material is reflowed by heating the material above its melting point to form spherical balls or bumps 371. In some applications, bumps 371 are reflowed a second time to improve electrical contact to conductive layer 368. The bumps can also be compression bonded to conductive layer 368. Bumps 371 represent one type of interconnect structure that can be formed over conductive layer 368. The interconnect structure can also use stud bump, micro bump, or other electrical interconnect.

An insulating or passivation layer 372 is formed over substrate 134 and conductive vias 136 using PVD, CVD, printing, spin coating, spray coating, sintering or thermal oxidation. The insulating layer 372 contains one or more layers of SiO2, Si3N4, SiON, Ta2O5, Al2O3, or other material having similar insulating and structural properties. A portion of insulating layer 372 is removed by an etching process to expose conductive vias 136.

An electrically conductive layer or RDL 374 is formed over insulating layer 372 and the exposed conductive vias 136 using a patterning and metal deposition process such as printing, PVD, CVD, sputtering, electrolytic plating, and electroless plating. Conductive layer 374 can be one or more layers of Al, Cu, Sn, Ni, Au, Ag, or other suitable electrically conductive material. Conductive layer 374 is electrically connected to conductive vias 136 and reroutes or extends lateral connectivity of the conductive vias.

An insulating or photoresist layer 376 is formed over insulating layer 372 and conductive layer 374 using PVD, CVD, printing, spin coating, spray coating, sintering or thermal oxidation. A portion of insulating layer 376 is removed by an etching process to expose a portion of conductive layer 374 laterally offset from conductive vias 136 for additional electrical interconnect.

Figure 13B:
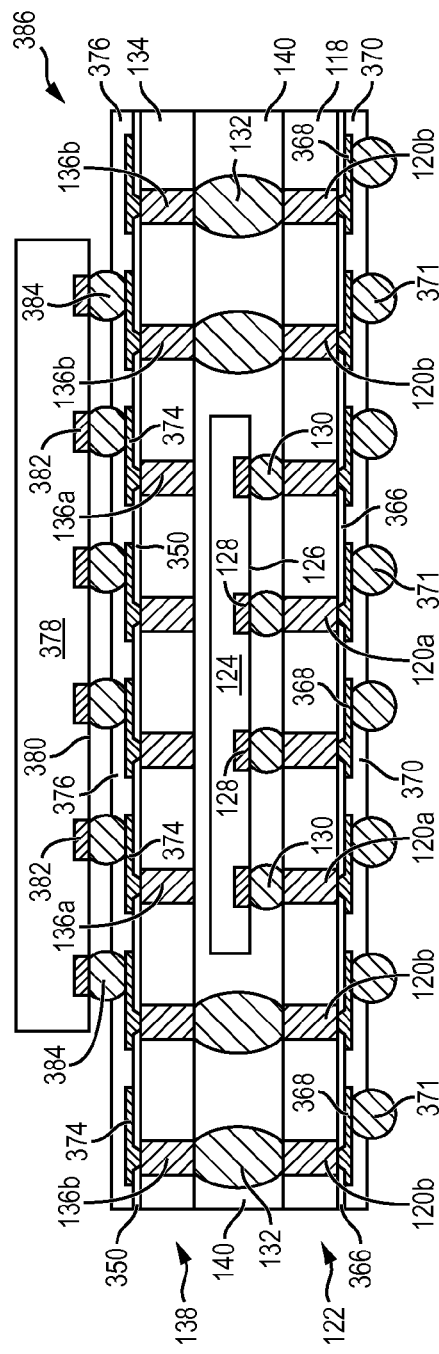

In FIG. 13b, semiconductor die 378 has an active surface 380 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 380 to implement analog circuits or digital circuits, such as DSP, ASIC, memory, or other signal processing circuit. Semiconductor die 378 may also contain IPDs, such as inductors, capacitors, and resistors, for RF signal processing. Contact pads 382 are formed in active surface 380 and electrically connected to the circuits on the active surface. Bumps 384 are formed over contact pads 382. In one embodiment, semiconductor die 378 is a flipchip type semiconductor die. Alternatively, semiconductor die 378 can be a wire-bond die. Semiconductor die 378 is mounted over TSV interposer 138 with bumps 384 metallurgically and electrically connected to conductive layer 374.

TSV interposers 122 and 138 are singulated with a saw blade or laser cutting tool into individual WLP 386. Within WLP 386, semiconductor die 124 is electrically connected to TSV interposers 122 and 138, RDLs 368 and 374, and bumps 132. Likewise, semiconductor die 378 is electrically connected to TSV interposers 122 and 138, RDLs 368 and 374, and bumps 132. Semiconductor die 124 is sandwiched between TSV interposers 122 and 138 for a thin structure with efficient z-direction vertical interconnect having a fine pitch and high I/O count. Penetrable encapsulant 140 provides a simple technique of sealing semiconductor die 124 with a heat dissipating feature.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first substrate having a plurality of first conductive vias formed partially through the first substrate;
   mounting a first semiconductor die over the first substrate, the first semiconductor die including an active surface and electrically connected to the plurality of the first conductive vias;
   depositing an underfill between the first semiconductor die and first substrate;
   providing a second substrate having a plurality of second conductive vias formed partially through the second substrate;
   disposing the second substrate over the first substrate and first semiconductor die;
   forming an interconnect structure between the first substrate and second substrate;
   disposing a penetrable encapsulant between the first substrate and second substrate by,
   (a) disposing the penetrable encapsulant over a surface of the second substrate, and
   (b) embedding the first semiconductor die and interconnect structure in the penetrable encapsulant by pressing the second substrate and the first substrate together;
   removing a portion of the first substrate to expose the first conductive vias;
   removing a portion of the second substrate to expose the second conductive vias; and
   wire bonding the active surface of the first semiconductor die to at least one of the first conductive vias.

2. The method of claim 1, wherein the interconnect structure includes one of a bump, a conductive pillar, and stacked bumps.

3. The method of claim 1, further including forming a third conductive via through the first semiconductor die.

4. The method of claim 1, further including disposing a second semiconductor die over the second substrate.

5. A method of making a semiconductor device, comprising:
   providing a first substrate having a plurality of first conductive vias formed partially through the first substrate;
   providing a second substrate having a plurality of second conductive vias formed partially through the second substrate;
   mounting a first semiconductor die between the first substrate and second substrate, the first semiconductor die having an active surface electrically connected to the plurality of the first conductive vias;
   disposing a second semiconductor die over both of the first substrate and the second substrate, wherein the second semiconductor die is electrically connected to the second conductive via;
   disposing a penetrable encapsulant between the first substrate and second substrate by,
   (a) disposing the penetrable encapsulant over a surface of the second substrate, and (b) embedding the first semiconductor die and interconnect structure in the penetrable encapsulant by pressing the second substrate and the first substrate together;

removing a portion of the first substrate to expose the first conductive vias;

removing a portion of the second substrate to expose the second conductive vias; and wire bonding the active surface of the first semiconductor die to at least one of the first conductive vias.

6. The method of claim 5, further including forming an interconnect structure between the first substrate and second substrate.

7. The method of claim 6, wherein the interconnect structure includes one of a bump, a conductive pillar, and stacked bumps.

8. The method of claim 5, further including disposing a second semiconductor die between the first substrate and second substrate.

9. A method of making a semiconductor device, comprising:

providing a first substrate including a plurality of first conductive vias formed partially through the first substrate;

providing a second substrate including a plurality of second conductive vias formed partially through the second substrate;

disposing a first semiconductor die between the first substrate and second substrate and electrically connected to the plurality of the first conductive vias;

disposing a second semiconductor die over the first semiconductor die and between both of the first substrate and the second substrate, wherein the second semiconductor die is electrically connected to the second conductive vias;

forming an interconnect structure between the first substrate and second substrate;

disposing a penetrable encapsulant over a surface of the second substrate;

embedding the first semiconductor die and interconnect structure in the penetrable encapsulant by pressing the second substrate and the first substrate together;

removing a portion of the first substrate to expose the first conductive vias; and removing a portion of the second substrate to expose the second conductive vias.

10. The method of claim 9, wherein the interconnect structure includes one of a bump, a conductive pillar, and stacked bumps.

11. The method of claim 9, further including disposing an underfill material between the first semiconductor die and the first substrate.

12. A semiconductor device, comprising:

a first substrate including a plurality of first conductive vias formed partially through the first substrate;

a second substrate including a plurality of second conductive vias formed partially through the second substrate;

a first semiconductor die disposed between the first substrate and the second substrate the first semiconductor die including an active surface and a back surface, wherein the active surface of the first semiconductor die is electrically connected with at least one of the first conductive vias;

a second semiconductor die having a back surface and mounted back surface-to-back surface with the first semiconductor die with a die attach adhesive formed between and wherein the second semiconductor die including an active surface and contact pads which are electrically connected to the active surface;

an interconnect structure formed between the first substrate and second substrate, wherein the first semiconductor die and the interconnect structure embed in penetrable encapsulant;

an underfill material disposed between the first semiconductor die and the first substrate;

a portion of the first substrate is removed to expose the first conductive vias; and a portion of the second substrate is removed to expose the second conductive vias.

13. The semiconductor device of claim 12, further including a third conductive via formed through the first semiconductor die.

14. The semiconductor device of claim 12, further including an encapsulant disposed between the first substrate and second substrate.

15. The semiconductor device of claim 12, wherein the interconnect structure includes one of a bump, a conductive pillar, and stacked bumps.

* * * * *